(12) United States Patent
Kim et al.

(10) Patent No.: US 12,334,486 B2
(45) Date of Patent: Jun. 17, 2025

(54) DISPLAY DEVICE AND METHOD OF MANUFACTURING THE SAME

(71) Applicant: Samsung Display Co., LTD., Yongin-si (KR)

(72) Inventors: In Woo Kim, Asan-si (KR); Chang Woo Kwon, Seoul (KR); Dae Cheol Kim, Hwaseong-si (KR); Jong Hwan Park, Hwaseong-si (KR); Yong Tae Cho, Yongin-si (KR); Kook Hyun Choi, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 497 days.

(21) Appl. No.: 17/889,916

(22) Filed: Aug. 17, 2022

(65) Prior Publication Data

US 2023/0230967 A1   Jul. 20, 2023

(30) Foreign Application Priority Data

Jan. 20, 2022   (KR) ........................ 10-2022-0008380

(51) Int. Cl.
*H01L 25/16* (2023.01)
*H01L 23/00* (2006.01)
(Continued)

(52) U.S. Cl.
CPC ............ *H01L 25/167* (2013.01); *H01L 24/24* (2013.01); *H01L 24/25* (2013.01); *H01L 24/82* (2013.01);
(Continued)

(58) Field of Classification Search
CPC . H01L 23/00; H01L 23/5389; H01L 23/5687; H01L 24/24; H01L 24/25;
(Continued)

(56) References Cited

U.S. PATENT DOCUMENTS

| 9,123,674 B2 | 9/2015 | Yamakita | |
|---|---|---|---|
| 2021/0280746 A1* | 9/2021 | Kim | H10H 20/84 |
| 2022/0375990 A1* | 11/2022 | Im | H10H 20/01 |

FOREIGN PATENT DOCUMENTS

| EP | 3 640 986 | 4/2020 |
|---|---|---|
| KR | 10-2020-0088954 | 7/2020 |

\* cited by examiner

*Primary Examiner* — Nikolay K Yushin
(74) *Attorney, Agent, or Firm* — KILE PARK REED & HOUTTEMAN PLLC

(57) ABSTRACT

A display device includes a conductive pattern on a substrate, a via layer on the conductive pattern with a via hole exposing the conductive pattern, a first electrode and a second electrode on the via layer and spaced apart from each other, a first insulating layer on the first electrode and the second electrode, a bank layer on the first insulating layer defining an emission area and a subarea, a light-emitting element on the first insulating layer, and a first connection electrode and a second connection electrode on the first insulating layer and the light-emitting element. The first connection electrode electrically contacts an end of the light-emitting element, and the second connection electrode electrically contacts another end of the light-emitting element. The bank layer includes a bank extension portion extended to the subarea and the bank extension portion overlaps at least a portion of the via hole.

20 Claims, 16 Drawing Sheets

(51) Int. Cl.
*H01L 27/12* (2006.01)
*H10D 86/01* (2025.01)
*H10D 86/40* (2025.01)
*H10D 86/60* (2025.01)

(52) U.S. Cl.
CPC ....... *H10D 86/0231* (2025.01); *H10D 86/441* (2025.01); *H10D 86/60* (2025.01); *H01L 24/95* (2013.01); *H01L 2224/24051* (2013.01); *H01L 2224/24145* (2013.01); *H01L 2224/24991* (2013.01); *H01L 2224/25175* (2013.01); *H01L 2224/82007* (2013.01); *H01L 2224/82106* (2013.01); *H01L 2224/95133* (2013.01)

(58) Field of Classification Search
CPC ....... H01L 24/82; H01L 24/95; H01L 25/167; H01L 25/16; H01L 25/0752; H01L 25/0753; H01L 2224/24051; H01L 2224/24145; H01L 2224/24991; H01L 2224/25175; H01L 2224/82007; H01L 2224/82106; H01L 2224/95133; H10H 20/84; H10H 20/01; H10H 20/032; H10H 20/0364; H10H 20/819; H10H 20/857; H10H 20/831; H10H 20/8506; H10D 86/0231; H10D 86/01; H10D 86/441; H10D 86/40; H10D 86/60; H10D 86/423
See application file for complete search history.

DISPLAY DEVICE AND METHOD OF MANUFACTURING THE SAME

CROSS-REFERENCE TO RELATED APPLICATION

This application claims priority to and benefit of Korean Patent Application No. 10-2022-0008380 under 35 U.S.C. § 119, filed on Jan. 20, 2022, in the Korean Intellectual Property Office (KIPO), the disclosure of which is incorporated by reference herein in its entirety.

BACKGROUND

1. Technical Field

The disclosure relates to a display device and a method of manufacturing the same.

2. Description of the Related Art

The importance of display devices is increasing with the development of multimedia. Accordingly, various display devices, such as an organic light-emitting display (OLED) device, a liquid crystal display (LCD) device, and the like, are used.

Display devices are devices that display an image, and include a display panel such as an organic light-emitting display panel or a liquid crystal display panel. Among these display panels, the display device may include light-emitting elements as a light-emitting display panel. For example, a light-emitting diode (LED) may include an organic light-emitting diode (OLED) that uses an organic material as a fluorescent material, an inorganic light-emitting diode that uses an inorganic material as a fluorescent material, or the like.

SUMMARY

Aspects of the disclosure provide a display device capable of preventing short-circuit of adjacent electrodes and a method of manufacturing the same.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, a display device may include a conductive pattern disposed on a substrate, a via layer disposed on the conductive pattern, comprising a via hole, and exposing the conductive pattern, a first electrode and a second electrode that are disposed on the via layer and spaced apart from each other, a first insulating layer disposed on the first electrode and the second electrode, a bank layer disposed on the first insulating layer defining an emission area and a subarea, a light-emitting element disposed on the first insulating layer in the emission area, and a first connection electrode and a second connection electrode that are disposed on the first insulating layer and the light-emitting element. The first connection electrode may electrically contact an end of the light-emitting element and the second connection electrode may electrically contact another end of the light-emitting element. The bank layer may include a bank extension portion extended to the subarea, and the bank extension portion may overlap at least a portion of the via hole in a plan view.

In an embodiment, the via hole may overlap the bank layer in a plan view, and at least a portion of the via hole may be disposed in the subarea.

In an embodiment, the bank extension portion may overlap at least a portion of the via hole disposed in the subarea in a plan view.

In an embodiment, the display device may further include a third connection electrode adjacent to the first connection electrode with the second connection electrode interposed therebetween. The first connection electrode and the third connection electrode may be disposed in parallel with each other in a plan view and may extend over the emission area and the subarea.

In an embodiment, the bank extension portion may be disposed between the first connection electrode and the third connection electrode, and the bank extension portion may protrude and extend from the bank layer in a direction parallel to the first connection electrode or the third connection electrode in a plan view.

In an embodiment, the via hole may overlap the first electrode and the first connection electrode, and the entire first via hole may overlap the first electrode, in a plan view.

In an embodiment, the first connection electrode may overlap a portion of the via hole and does not overlap the bank extension portion in a plan view.

In an embodiment, an entire area of the bank extension portion may overlap the first electrode in a plan view.

In an embodiment, a side of the bank extension portion may be disposed outside of a side of the adjacent first electrode in a plan view.

In an embodiment, a side of the bank extension portion may be disposed outside of a side of the adjacent conductive pattern in a plan view.

In an embodiment, the display device may further include a protective layer disposed between the conductive pattern and the via layer. The via hole may penetrate the via layer and the protective layer and may expose the conductive pattern.

In an embodiment, the display device may further include a second insulating layer disposed on the first insulating layer and the light-emitting element, and a third insulating layer disposed on the second insulating layer and overlapping the second connection electrode in a plan view. The second insulating layer and the third insulating layer may overlap the bank layer in a plan view.

According to an embodiment of the disclosure, a display device may include a conductive pattern disposed on a substrate, a via layer disposed on the conductive pattern, comprising a via hole, and exposing the conductive pattern, a first electrode and a second electrode that are disposed on the via layer and spaced apart from each other, and a bank layer disposed on the via layer and defining an emission area and a subarea. The bank layer may include a bank extension portion extended to the subarea. The first electrode may extend from the emission area to the subarea and may be electrically connected to the conductive pattern through the via hole. At least a portion of the via hole may be disposed in the subarea. The bank extension portion may overlap the via hole and the first electrode in the subarea in a plan view.

In an embodiment, the display device may further include a first connection electrode disposed on the first electrode and a second connection electrode disposed on the second electrode. The via hole and the bank extension portion may be disposed between the first connection electrode and the second connection electrode.

In an embodiment, at least a portion of the via hole may overlap the bank extension portion in a plan view, and another portion of the via hole may not overlap the bank extension portion in a plan view.

According to an embodiment of the disclosure, a method of manufacturing a display device may include forming a conductive pattern on a substrate, forming, on the conductive pattern, a via layer comprising a via hole exposing the conductive pattern, forming a first electrode and a second electrode that are spaced apart from each other on the via layer, forming, on the via layer, a bank layer defining an emission area and a subarea, the bank layer comprising a bank extension portion extending to the subarea, forming a light-emitting element on the first electrode and the second electrode in the emission area, and forming a first connection electrode in electrical contact with an end of the light-emitting element and a second connection electrode in electrical contact with another end of the light-emitting element. The bank extension portion may overlap at least a portion of the via hole in a plan view.

In an embodiment, the bank layer and the bank extension portion may be simultaneously formed by forming a bank material layer on the via layer and patterning the bank material layer.

In an embodiment, the method may further include, before the forming of the via layer, forming a protective layer disposed on the conductive pattern. The via hole may be formed by simultaneously etching both the protective layer and the via layer such that at least a portion of the via hole is disposed in the subarea.

In an embodiment, an entire area of the bank extension portion may overlap the first electrode in a plan view.

In an embodiment, the bank extension portion may overlap the first electrode and the conductive pattern in a plan view.

According to embodiments of the disclosure, in a display device and a method of manufacturing the same, a bank extension portion that overlaps a via hole disposed between a first connection electrode and a second connection electrode may be formed, so that a step difference of the via hole may be reduced, thereby preventing a short-circuit defect between the first connection electrode and the second connection electrode.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
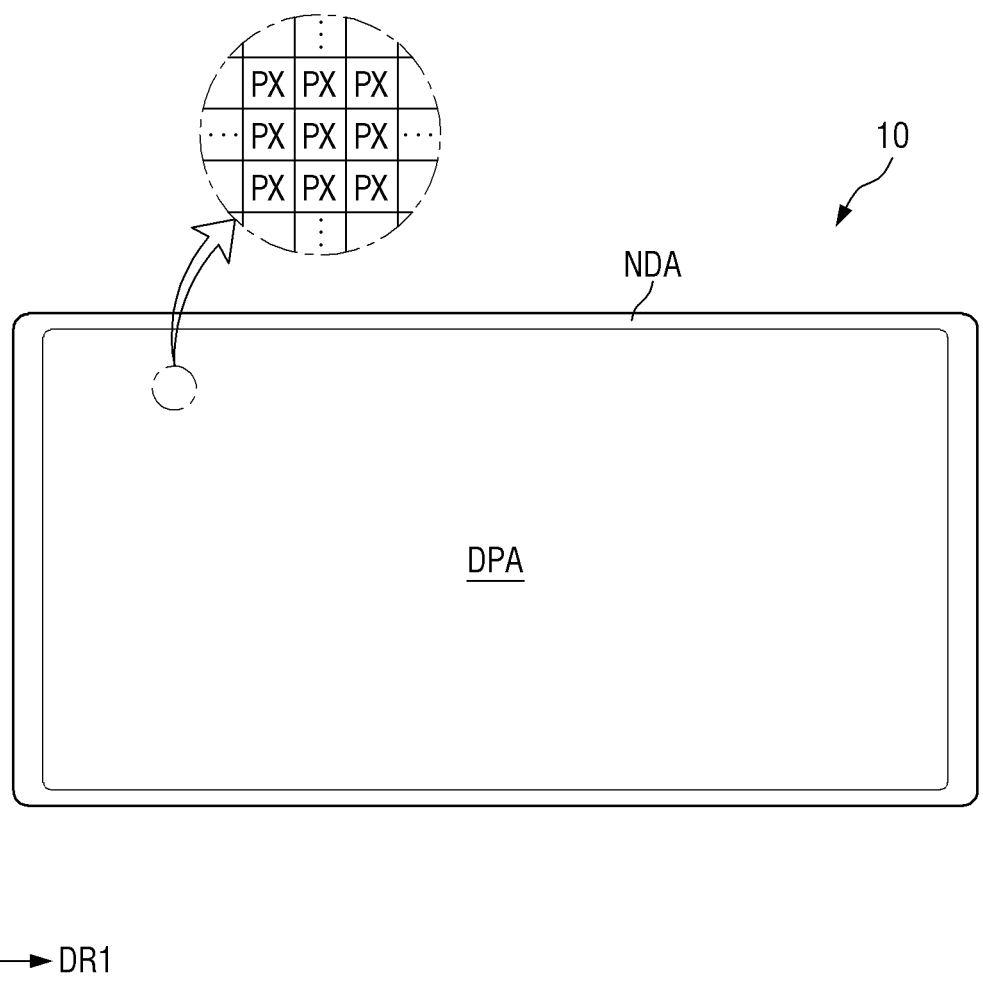
FIG. 1 is a schematic plan view of a display device according to an embodiment of the disclosure.

The disclosure will now be described more fully hereinafter with reference to the accompanying drawings, in which embodiments of the disclosure are shown. This invention may, however, be embodied in different forms and should not be construed as limited to the embodiments set forth herein. Rather, these embodiments are provided so that this disclosure will be thorough and complete, and will filly convey the scope of the disclosure to those skilled in the art.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments of the disclosure will be described with reference to the attached drawings.

FIG. 1 is a schematic plan view of a display device according to an embodiment of the disclosure.

Referring to FIG. 1, a display device 10 may display moving images or still images. The display device 10 may refer to any electronic device that includes a display screen. Non-limiting examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders, all of which provide a display screen.

The display device 10 may include a display panel that provides a display screen. Examples of the display panel include an inorganic light-emitting display panel, an organic light-emitting display panel, a quantum dot light-emitting display panel, a plasma display panel, a field emission display panel, and the like. In the following description, for convenience of explanation, an inorganic light-emitting display panel is employed as an example of the display panel. However, embodiments are not limited thereto, and other display panels are also applicable within the scope and technical spirit of the disclosure.

In the drawings illustrating the display device 10, a first direction DR1, a second direction DR2, and a third direction DR3 are defined. The first direction DR1 and the second direction DR2 may be directions perpendicular to each other in one plane. The third direction DR3 may be a direction perpendicular to the plane in which the first direction DR1 and the second direction DR2 are located. The third direction DR3 may be perpendicular to each of the second direction DR1 and the second direction DR2. In the embodiment of FIG. 1 which illustrates the display device 10, the third direction DR3 may indicate a thickness direction of the display device 10.

The shape of the display device 10 may be variously modified. For example, the display device 10 may have a rectangular shape having long sides in the first direction DR1 and short sides in the second direction DR2 in a plan view. In another example, the display device 10 may have a rectangular shape having long sides in the second direction DR2 and short sides in the first direction DR1 in a plan view. However, the disclosure is not limited thereto, and the shape of the display device 10 may have other planar shapes such as a square, a quadrangle with rounded corners (vertices), other polygons, and a circle. The shape of a display area DPA of the display device 10 may also be similar to the overall shape of the display device 10. In FIG. 1, each of the display device 10 and the display area DPA may have a rectangular shape having long sides in the first direction DR1 and short sides in the second direction DR2.

The display device 10 may include the display area DPA and a non-display area NDA. The display area DPA may be an area where an image can be displayed, and the non-display area NDA may be an area where no image is displayed. The display area DPA may also be referred to as an active area, and the non-display area NDA may also be referred to as an inactive area. The display area DA may generally occupy a center portion of the display device 10.

The display area DA may include multiple pixels PX. The pixels PX may be arranged in matrix. Each of the pixels PX may be rectangular or square in a plan view. However, the shape of each of the pixels PX is not limited thereto and may also be a rhombic shape having each side inclined with respect to a direction. The pixels PX may be alternately arranged in a stripe or PENTILE™ pattern. Each of the pixels PX may include one or more light-emitting elements which emit light of a specific wavelength band to display a specific color.

The non-display area NDA may be disposed adjacent to the display area DPA. The non-display area NDA may completely or partially surround the display area DPA. The display area DPA may be rectangular, and the non-display area NDA may be disposed adjacent to four sides of the display area DPA. The non-display area NDA may form a bezel of the display device 10. Lines or circuit drivers included in the display device 10 or external devices may be disposed in the non-display area NDA.

Figure 2:
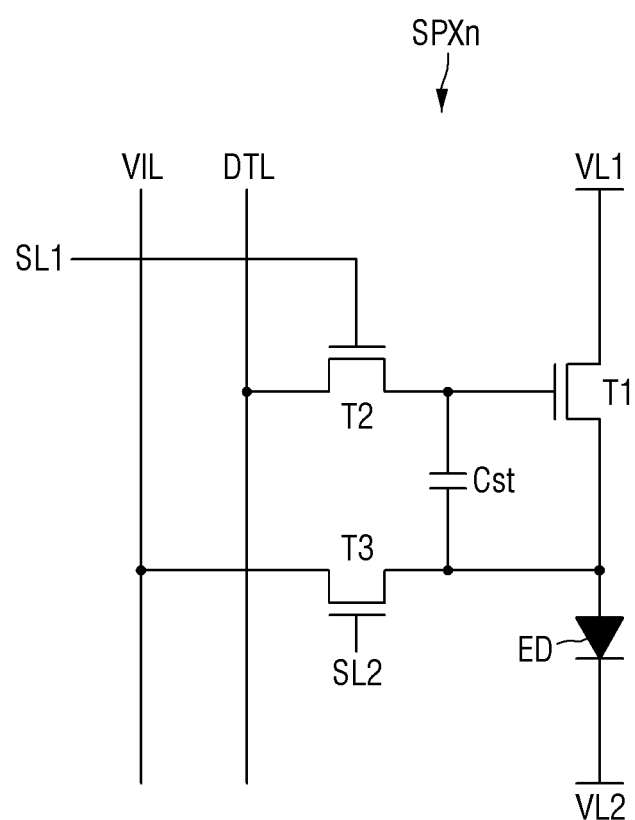
FIG. 2 is schematic diagram of an equivalent circuit of a subpixel of a display device according to an embodiment of the disclosure.

FIG. 2 is schematic diagram of an equivalent circuit of a subpixel of a display device according to an embodiment of the disclosure.

Referring to FIG. 2, each subpixel SPXn of a display device according to an embodiment may include three transistors T1, T3, and T3 and one storage capacitor Cst, in addition to a light-emitting element ED.

The light-emitting element ED may emit light according to a current supplied through a first transistor T1. The light-emitting element ED may emit light of a specific wavelength band in response to electrical signals received from a first electrode and a second electrode that are electrically connected to both ends of the light-emitting element ED.

A first end of the light-emitting element ED may be electrically connected to a source electrode of the first transistor T1, and a second end of the light-emitting element ED may be electrically connected to a second voltage line VL2 to which a low-level voltage (hereinafter, referred to as a second supply voltage), lower than a high-level voltage (hereinafter, referred to as a first supply voltage) of a first voltage line VL1, is supplied.

The first transistor T1 may adjust a current flowing from the first voltage line VL1, to which the first supply voltage is supplied, to the light-emitting element ED according to a voltage difference between a gate electrode and the source electrode. For example, the first transistor T1 may be a driving transistor for driving the light-emitting element ED. The first transistor T1 may have the gate electrode electrically connected to the source electrode of the second transistor T2, and the source electrode electrically connected to the first end of the light-emitting element ED. A drain electrode of the first transistor T1 may be electrically connected to the first voltage line VL1 to which the first supply voltage is applied.

The second transistor T2 may be turned on by a scan signal of a first scan line SL1 to electrically connect a data line DTL to the gate electrode of the first transistor T1. The second transistor T2 may have a gate electrode electrically connected to the first scan line SL1, the source electrode electrically connected to the gate electrode of the first transistor T1, and a drain electrode electrically connected to the data line DTL.

A third transistor T3 may be turned on by a scan signal of a second scan line SL2 to electrically connect an initialization voltage line VIL to the first end of the light-emitting element ED. The third transistor T3 may have a gate electrode electrically connected to the second scan line SL2, a drain electrode electrically connected to the initialization voltage line VIL, and a source electrode electrically connected to the first end of the light-emitting element ED or the source electrode of the first transistor T1. In the drawings, the first scan line SL1 is illustrated as being distinct from the second scan line SL2, but the disclosure is not limited thereto. In some embodiments, the first scan line SL1 and the second scan line SL2 may be formed as one line, and the second transistor T2 and the third transistor T3 may be simultaneously turned on by a same scan signal.

In an embodiment, the source electrode and the drain electrode of each of the transistors T1, T2, and T3 are not limited to the above description, and may be reversed. Each of the transistors T1, T2, and T3 may be formed as a thin-film transistor. Each of the transistors T1, T2, and T3 in FIG. 2 may be an N-type metal oxide semiconductor field effect transistor (MOSFET), the disclosure is not limited thereto. For example, each of the transistors T1, T2, and T3 may also be a P-type MOSFET, or some of the transistors T1, T2, and T3 may be N-type MOSFETs, and the other may be a P-type MOSFET.

The storage capacitor Cst may be formed between the gate electrode and the source electrode of the first transistor T1. The storage capacitor Cst may store voltage difference between a gate voltage and a source voltage of the first transistor T1.

The structure of a pixel PX of the display device 10 according to an embodiment will now be described in more detail by further referring to another drawing.

Figure 3:
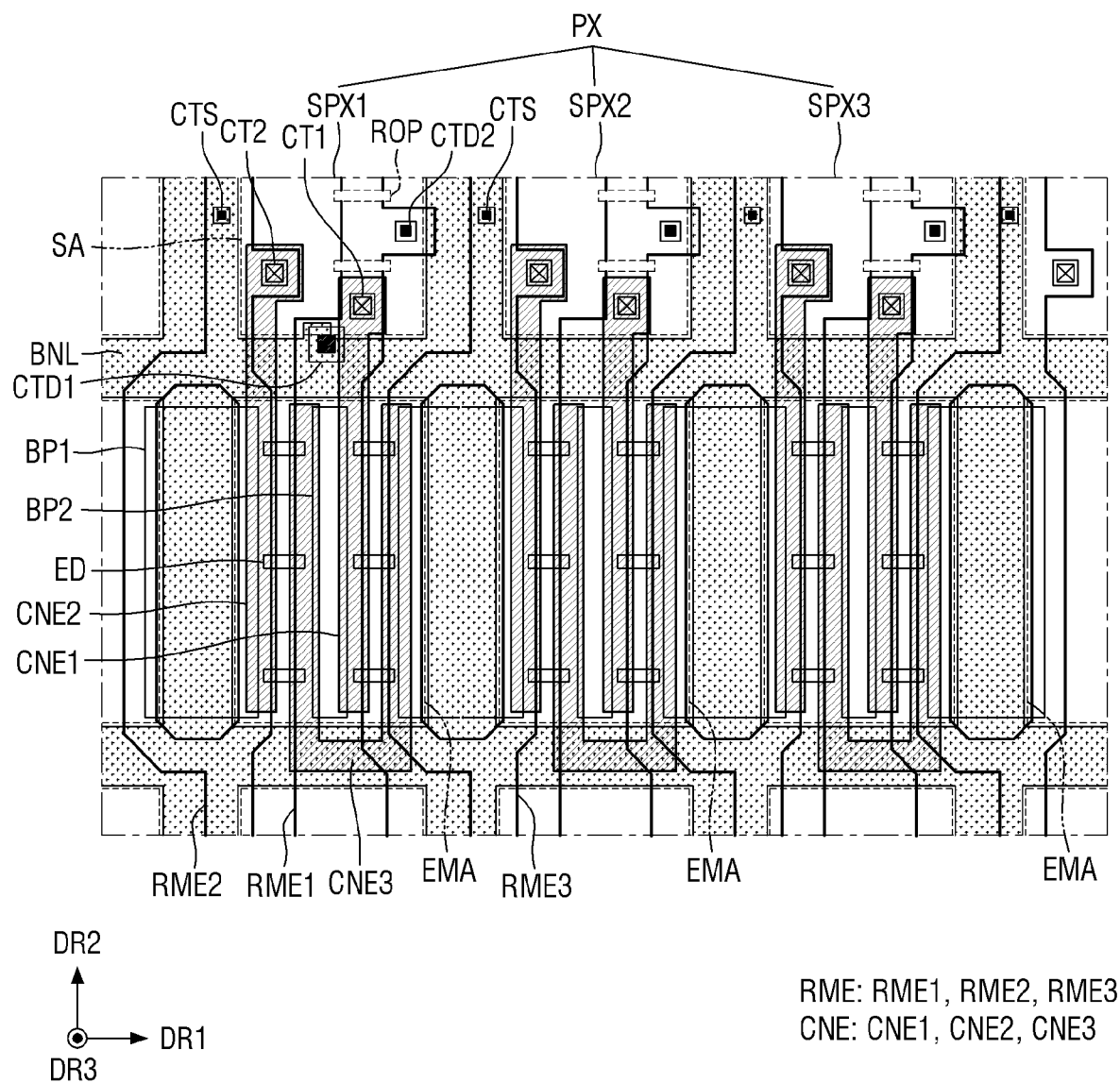
FIG. 3 is a plan view of one pixel of a display device according to an embodiment of the disclosure.

FIG. 3 is a plan view of one pixel of a display device according to an embodiment of the disclosure.

Referring to FIG. 3, each of the pixels PX of the display device 10 may include multiple subpixels SPXn (where n is an integer of 1 to 3). For example, a pixel PX may include a first subpixel SPX1, a second subpixel SPX2, and a third subpixel SPX3. The first subpixel SPX1 may emit light of a first color, the second subpixel SPX2 may emit light of a second color, and the third subpixel SPX3 may emit light of a third color. For example, the first color may be red, the second color may be green, and the third color may be blue. However, the disclosure is not limited thereto, and the subpixels SPXn may emit light of the same color. In another embodiment, each of the subpixels SPXn may emit light of a blue color. Although one pixel PX includes three subpixels SPXn in FIG. 3, embodiments are not limited thereto, and the pixel PX may include more than three subpixels SPXn.

Each subpixel SPXn of the display device 10 may include an emission area EMA and a non-emission area. The emission area EMA may be defined as an area where light-emitting elements ED are disposed to emit light of a specific wavelength band. The non-emission area may be an area in which the light-emitting elements ED are not disposed and from which no light is output because light emitted from the light-emitting elements ED does not reach this area. The emission area EMA may include an area in which the light-emitting elements ED are disposed and an area which is adjacent to the light-emitting elements ED and to which light emitted from the light-emitting elements ED is output.

However, the disclosure is not limited thereto, and the emission area EMA may also include an area from which light emitted from the light-emitting elements ED is output after being reflected or refracted by other members. Multiple light-emitting elements ED may be disposed in each subpixel SPXn, and an area where the light-emitting elements ED are disposed and an area adjacent to this area may form the emission area EMA.

Although the emission areas EMA of the subpixels SPXn have substantially the same area in the drawing, the disclosure is not limited thereto. In some embodiments, each of the emission areas EMA of the subpixels SPXn may have a different area depending on the color or wavelength band of light emitted from the light-emitting elements ED disposed in the corresponding subpixel SPXn.

Also, each subpixel SPXn may include a subarea SA disposed in the non-emission area. The subarea SA may be disposed on a side of the emission area EMA in the second direction DR2 and may be disposed between the emission areas EMA of subpixels SPXn neighboring (or adjacent) in the second direction DR2. For example, the emission areas EMA and the subareas SA may be repeatedly arranged in the second direction DR2 and may be alternately arranged. However, the disclosure is not limited thereto, and the emission areas EMA and the subareas SA in each of the pixels PX may have arrangement different from that shown in FIG. 3. In a pixel PX shown in FIG. 3, an emission area EMA and a subarea SA disposed above the emission area EMA in the second direction DR2 may be included in a subpixel SPXn, and a portion disposed on the opposite side of the emission area EMA in the second direction DR2 may be a subarea SA of another subpixel SPXn.

A bank layer BNL may be disposed between the subareas SA and the emission areas EMA, and the distance between the subareas SA and the emission areas EMA may vary depending on the width of the bank layer BNL. No light-emitting elements ED may be disposed in the subarea SA so that no light is emitted from the subarea SA, but parts of electrodes RME1, RME2, and RME3 may be disposed in the subarea SA. Parts of electrodes RME disposed in different subpixels SPXn may be disposed to be separate from one another in a separation portion ROP of the subarea SA.

The bank layer BNL may include portions extending in the first direction DR1 and the second direction DR2 to form a lattice pattern, in a plan view, on the front surface of the display area DPA. The bank layer BNL may be disposed along the boundaries between each of the subpixels SPXn to define each of the neighboring subpixels SPXn. Also, the bank layer BNL may be disposed to surround the emission area EMA of each of the subpixels SPXn to separate the emission area EMA of each of the subpixels SPXn.

The display device 10 may include multiple electrodes RME (e.g., RME1, RME2, and RME3), bank patterns BP1 and BP2, the light-emitting elements ED (e.g., ED1 and ED2), and connection electrodes CNE (e.g., CNE1, CNE2, and CNE3). Configurations of these components will be described below.

Each pixel PX or subpixel SPXn of the display device 10 may include a pixel driving circuit (not shown). The above-described lines may transmit a driving signal to each pixel driving circuit while passing through and/or around each pixel PX. The pixel driving circuit may include a transistor and a capacitor. The number of transistors and capacitors in each pixel driving circuit may be variously changed. According to an embodiment, each subpixel SPXn of the display device 10 may have a 3T1C structure, in which the pixel driving circuit includes three transistors and one capacitor as described above with reference to FIG. 2. However, the disclosure is not limited thereto, and other various pixel structures (such as a 2T1C structure, a 7T1C structure, and/or a 6T1C structure) may be also applicable.

Figure 4:
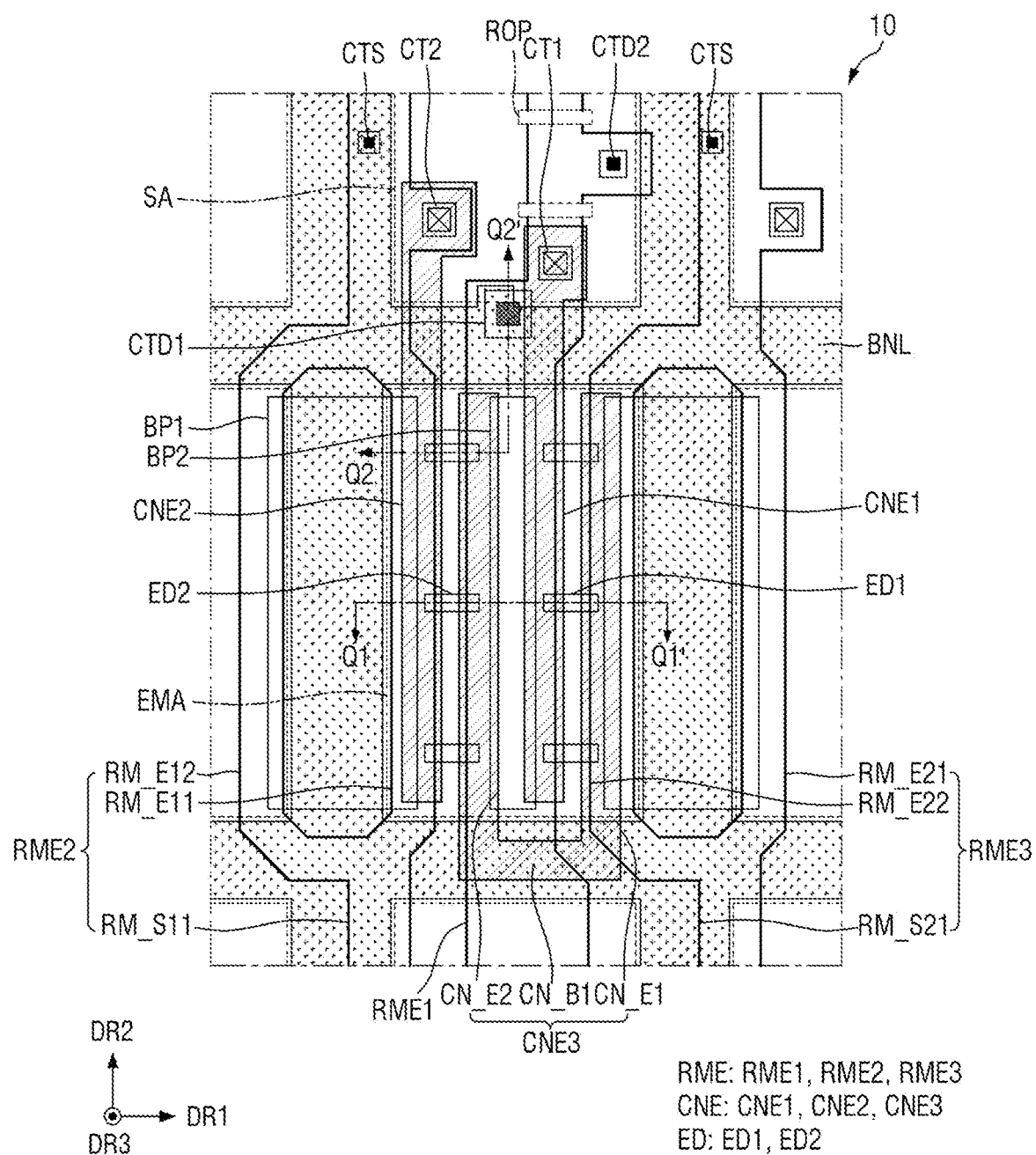
FIG. 4 is a plan view of a first subpixel of FIG. 3.
Figure 5:
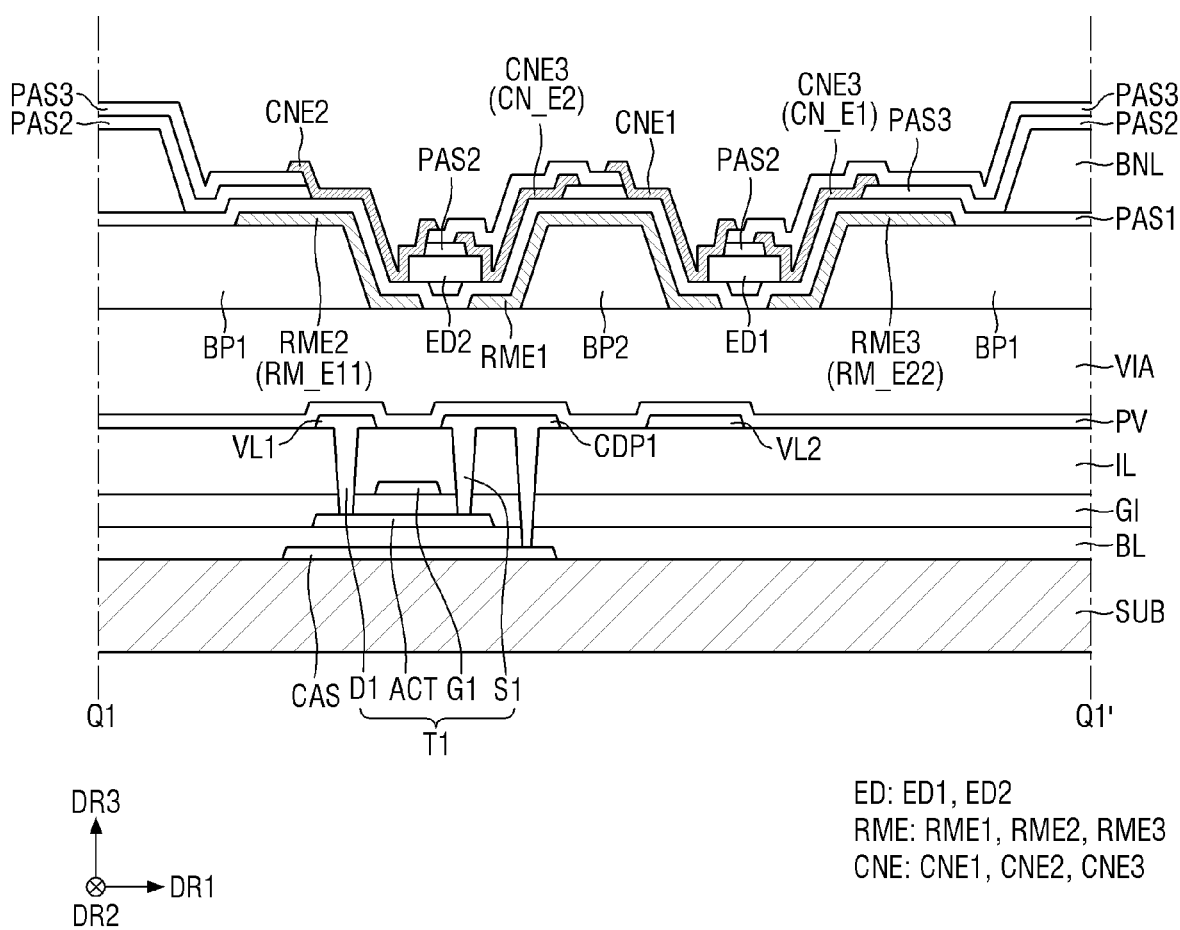
FIG. 5 is a schematic cross-sectional view taken along line Q1-Q1' of FIG. 4.
Figure 6:
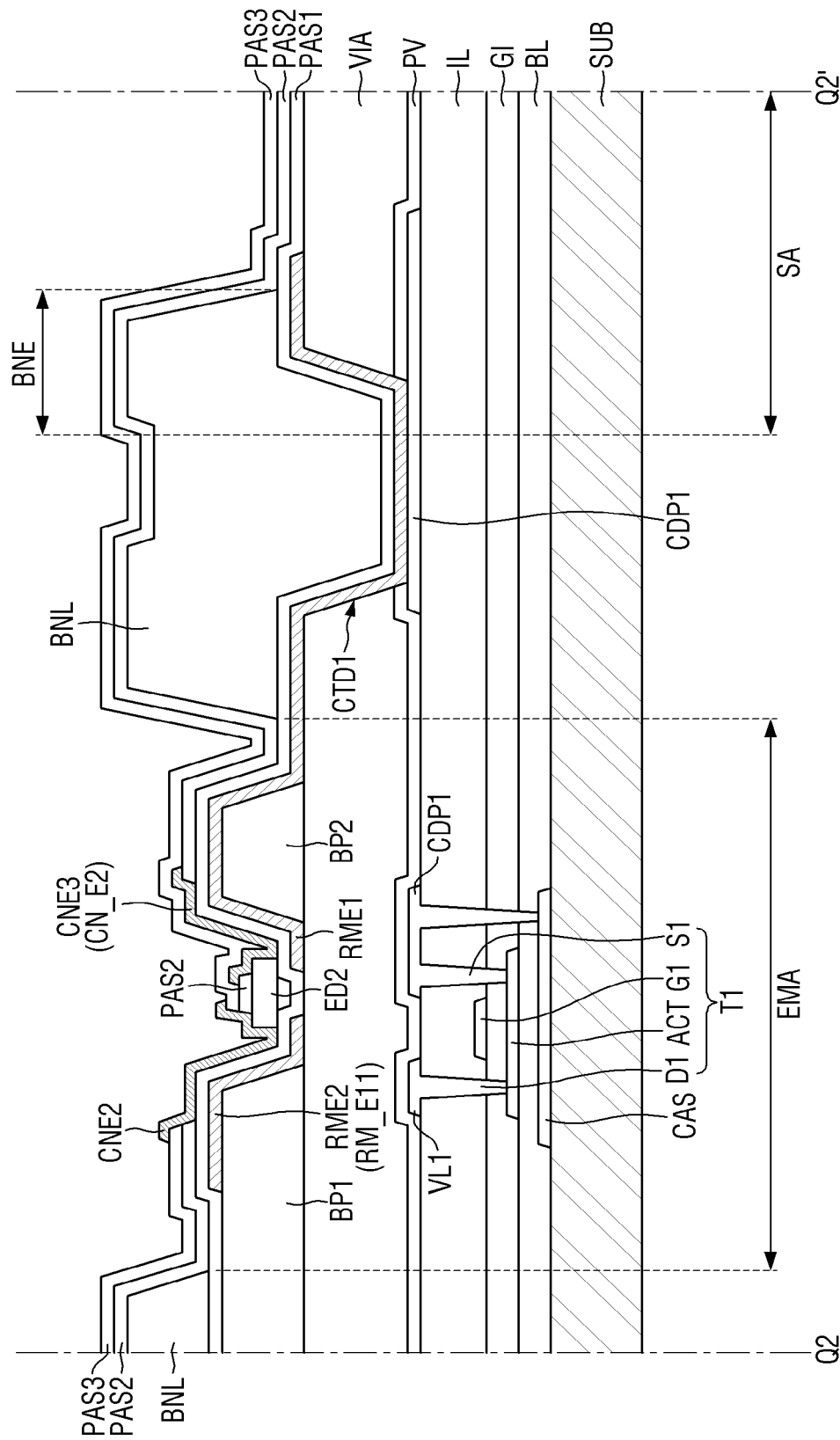
FIG. 6 is a schematic cross-sectional view taken along line Q2-Q2' of FIG. 4.
Figure 7:
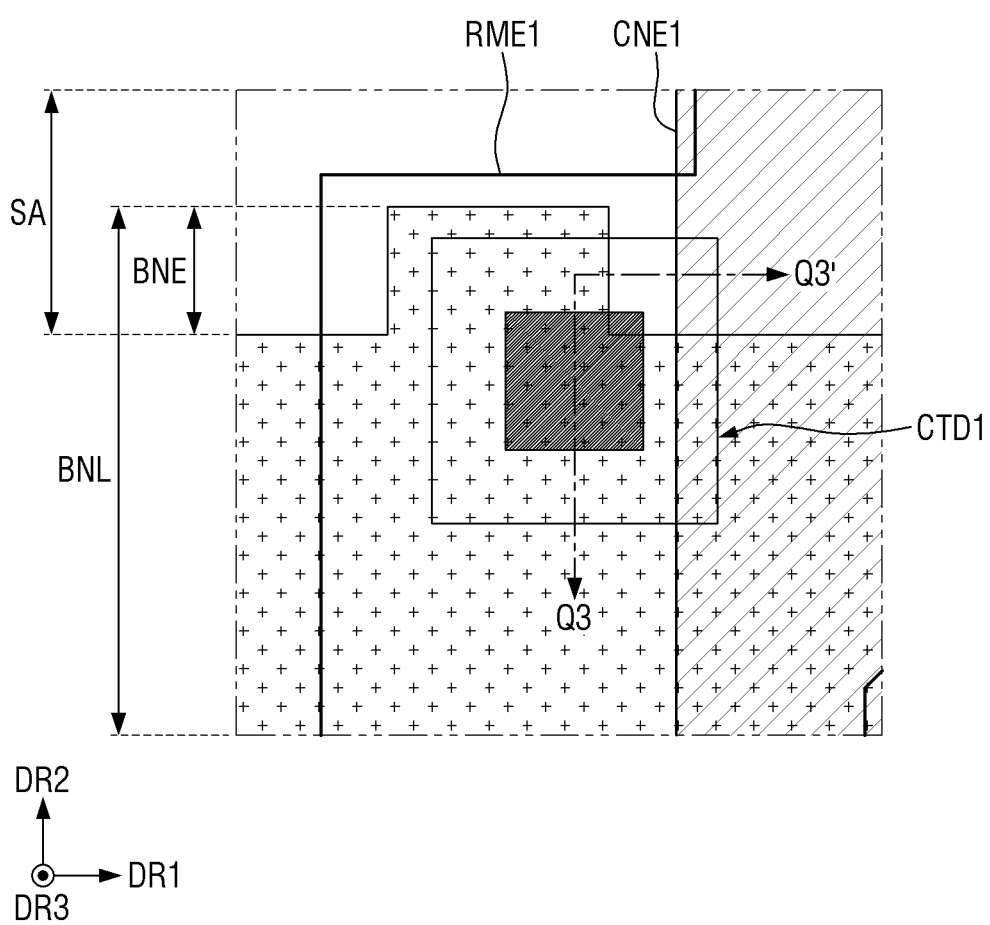
FIG. 7 is a plan view of a first via hole according to an embodiment of the disclosure.
Figure 8:
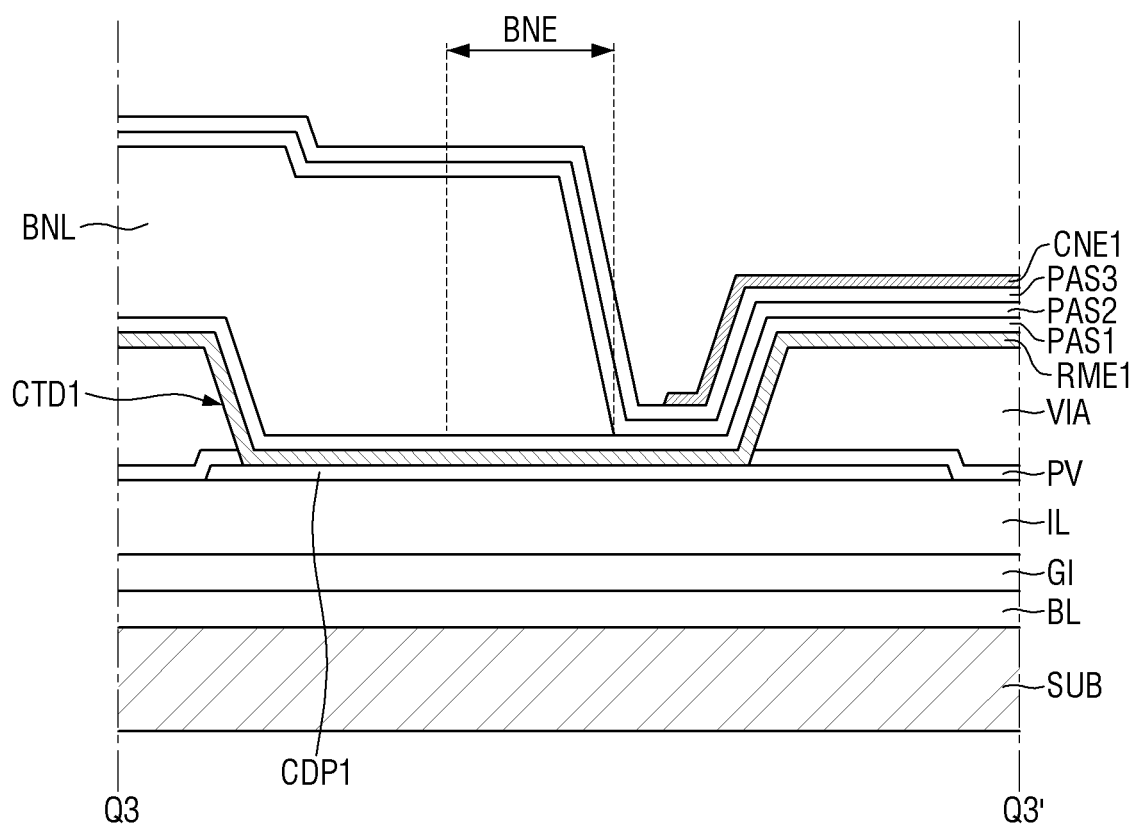
FIG. 8 is a schematic cross-sectional view taken along line Q3-Q3' of FIG. 7.

FIG. 4 is a plan view of a first subpixel of FIG. 3. FIG. 5 is a schematic cross-sectional view taken along line Q1-Q1' of FIG. 4. FIG. 6 is a schematic cross-sectional view taken along line Q2-Q2' of FIG. 4. FIG. 7 is a plan view of a first via hole according to an embodiment of the disclosure. FIG. 8 is a schematic cross-sectional view taken along line Q3-Q3' of FIG. 7.

Referring to FIGS. 4 to 8 in conjunction with FIG. 3, the display device 10 may include a substrate SUB, a semiconductor layer disposed on the substrate SUB, multiple conductive layers, and multiple insulating layers. The semiconductor layer, the conductive layers, and the insulating layers may form (or constitute) a circuit layer and a display element layer of the display device 10.

Specifically, the substrate SUB may be an insulating substrate. The substrate SUB may be made of an insulating material such as glass, quartz, or polymer resin. The substrate SUB may be a rigid substrate but may be a flexible substrate that may be bent, folded, or rolled.

A first conductive layer may be disposed on the substrate SUB. The first conductive layer may include a lower metal layer CAS, and the lower metal layer CAS may overlap an active layer ACT of a first transistor T1. The lower metal layer CAS may include a light blocking material to prevent light from entering the active layer ACT of the first transistor T1. However, the lower metal layer CAS may be omitted.

The buffer layer BL may be disposed on the lower metal layer CAS and the substrate SUB. The buffer layer BL may be formed on the substrate SUB to protect the first transistors T1 from moisture introduced through the substrate SUB which is vulnerable to moisture penetration and may perform a surface planarization function.

The semiconductor layer may be disposed on the buffer layer BL. The semiconductor layer may include the active layer ACT of the first transistor T1. The active layer ACT of the first transistor T1 may partially overlap a gate electrode G1 of a second conductive layer which will be described below.

The semiconductor layer may include polycrystalline silicon, monocrystalline silicon, an oxide semiconductor, or the like. The oxide semiconductor may include indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

Although only the first transistor T1 among the transistors included in each subpixel SPXn of the display device 10 is illustrated in the drawings, the disclosure is not limited thereto. The display device 10 may include multiple transistors.

A gate insulating layer GI may be disposed on the active layer ACT. The gate insulating layer GI may serve as a gate insulating film of the first transistor T1.

The second conductive layer may be disposed on the gate insulating layer GI. The second conductive layer may include the gate electrode G1 of the first transistor T1. The gate electrode G1 may overlap a channel region of the active layer ACT in the third direction DR3 that is a thickness direction.

An interlayer insulation layer IL may be disposed on the second conductive layer. The interlayer insulating layer IL may function as an insulating film between the second conductive layer and other layers disposed on the second conductive layer, and may protect the second conductive layer.

A third conductive layer may be disposed on the interlayer insulating layer IL. The third conductive layer may include a first voltage line VL1, a second voltage line VL2, and a conductive pattern CDP1.

A high-level voltage (e.g., a first supply voltage) may be applied to the first voltage line VL1 to be transmitted to the first electrode RME1, and a low-level voltage (e.g., a second supply voltage) may be applied to the second voltage line VL2 to be transmitted to the second electrode RME2. A portion of the first voltage line VL1 may be in contact with the active layer ACT of the first transistor T1 through a contact hole penetrating the interlayer insulating layer IL and the gate insulating layer GI. The first voltage line VL1 may serve as a first drain electrode D1 of the first transistor T1. The second voltage line VL2 may be directly connected to the second electrode RME2 which will be described below. Also, the first voltage line VL1 may be electrically connected to a first connection electrode CNE1 which will be described below, and the second voltage line VL2 may be electrically connected to a second connection electrode CNE2 which will be described below.

The first conductive pattern CDP1 may be in contact with the active layer ACT of the first transistor T1 through the contact hole penetrating the interlayer insulating layer IL and the gate insulating layer GI. The first conductive pattern CDP1 may be in contact with the lower metal layer CAS through another contact hole. The first conductive pattern CDP1 may serve as a source electrode S1 of the first transistor T1.

A protective layer PV may be disposed on the third conductive layer and the interlayer insulating layer IL. The protective layer PV may function as an insulating film between the third conductive layer and other layers disposed on the third conductive layer, and may protect the third conductive layer.

The buffer layer BF, the gate insulating layer GI, the interlayer insulating layer IL, and the protective layer PV described above may consist of multiple inorganic layers that are alternately stacked each other. For example, each of the buffer layer BL, the gate insulating layer GI, the interlayer insulating layer IL, and the protective layer PV may be formed as a double layer or multilayer in which one or more inorganic layers including at least one of silicon oxide ($SiO_x$), silicon nitride ($SiN_x$), and silicon oxynitride ($SiO_xN_y$) are alternately stacked each other. However, the disclosure is not limited thereto, and each of the buffer layer BL, the gate insulating layer GI, the interlayer insulating layer IL, and the protective layer PV may be formed as a single inorganic layer including at least one of the insulating materials described above. In some embodiments, the interlayer insulating layer IL may be made of an organic insulating material, such as polyimide (PI).

The second conductive layer and the third conductive layer may be made up of a single layer or multiple layers including at least one of molybdenum (Mo), aluminum (Al), chromium (Cr), gold (Au), titanium (Ti), nickel (Ni), neodymium (Nd), copper (Cu), or an alloy thereof. However, the disclosure is not limited thereto.

A via layer VIA may be disposed on the protective layer PV. The via layer VIA may include an organic insulating material, such as polyimide (PI), and may perform a surface planarization function.

On the via layer VIA, multiple electrodes RME (RME1, RME2, and RME3), multiple bank patterns BP1 and BP2, multiple light-emitting elements ED (ED1 and ED2), and multiple connection electrodes CNE (CNE1, CNE2, and CNE3) may be disposed as a display element layer. Multiple insulating layers PAS1, PAS2, and PAS3 may be also disposed on the via layer VIA.

The bank patterns BP1 and BP2 may be disposed directly on the via layer VIA. The bank patterns BP1 and BP2 may include first bank patterns BP1 and a second bank pattern BP2. The first bank patterns BP1 may be disposed in the emission area EMA and the non-emission area of the subpixel SPXn. The first bank patterns BP1 may be disposed over the neighboring subpixels SPXn in the first direction DR1. The first bank patterns BP1 may have a shape extending in the second direction DR2 and may be spaced apart from each other in the first direction DR1. The first bank patterns BP1 may have the same width, but the disclosure is not limited thereto. The first bank patterns BP1 may each have a different width. The length of the first bank patterns BP1 extending in the second direction DR2 may be smaller than the length of the emission area EMA, which is surrounded by the bank layer BNL, in the second direction DR2.

The second bank pattern BP2 may be disposed in the emission area EMA of the subpixel SPXn and may have a shape extending in the second direction DR2. The second bank pattern BP2 may be disposed between the first bank patterns BP1 and spaced apart from the first bank patterns BP1. The second bank pattern BP2 may form an island-shaped pattern having a relatively narrow width and extending in the second direction DR2 in the emission area EMA of each subpixel SPXn on the entire surface of the display area DPA.

The second bank pattern BP2 may be disposed in the center of the emission area EMA, and the first bank patterns BP1 may be spaced apart from the second bank pattern BP2 with the second bank pattern BP2 interposed therebetween. The first bank patterns BP1 and the second bank pattern BP2 may be arranged alternately in the first direction DR1. The light-emitting elements ED may be disposed between the first bank patterns BP1 and the second bank pattern BP2.

The first bank patterns BP1 and the second bank pattern BP2 may have the same length in the second direction DR2, and their width in the first direction DR1 may be different from each other. A portion of the bank layer BNL extending in the second direction DR2 may overlap the first bank patterns BP1 in the thickness direction (e.g., the third direction DR3). The bank patterns BP1 and BP2 may be disposed in an island-shaped pattern on the entire surface of the display area DPA. The light-emitting elements ED may be disposed between the bank patterns BP1 and BP2 spaced apart from each other.

The bank patterns BP1 and BP2 may have a structure that at least partly protrudes from the upper surface of the via layer VIA. The protrusions of the bank patterns BP1 and BP2 may have inclined or curved side surfaces. Unlike in the drawing, the bank patterns BP1 and BP2 may have an outer surface in the shape of a semicircle or a semi ellipse in cross-sectional view. The bank patterns BP1 and BP2 may include, but are not limited to, an organic insulating material, such as polyimide (PI).

The electrodes RME may have a shape extending in a direction in a plan view and may be disposed in each of the subpixels SPXn. The electrodes RME may have a shape extending in the second direction DR2, may be disposed in the emission area EMA and the subarea SA, and may be spaced apart from each other in the first direction DR1. The display device 10 may include the first electrode RME1, the second electrode RME2, and a third electrode RME3 that are disposed in each subpixel SPXn. For example, the first electrode RME1 may be disposed at the center of the emission area EMA. The second electrode RME2 may be spaced apart from the first electrode RME1 in the first direction DR1 and may be disposed on the left side with respect to the center of the emission area EMA. The third electrode RME3 may be spaced apart from the first electrode RME1 in the first direction DR1 and may be disposed in the right side with respect to the center of the emission area EMA.

The first electrode RME1 may be disposed on the second bank pattern BP2 disposed at the center of the emission area EMA, a portion of the second electrode RME2 may be disposed on the first bank pattern BP1 disposed on the left side of the emission area EMA, and a portion of the third electrode RME3 may be disposed on the first bank pattern BP1 disposed on the right side of the emission area EMA. The electrodes RME may be disposed at least on the inclined side surface of each of the bank patterns BP1 and BP2. In an embodiment, a width of the first electrode RME1 in the first direction DR1 may be greater than the width of the second bank pattern BP2, and the width of the second electrode RME2 and the third electrode RME3 in the first direction DR1 may be smaller than the width of the first bank pattern BP1. At least portion of each of the electrodes RME may be disposed directly on the via layer VIA and thus may be disposed on the same plane.

In an embodiment, a first electrode RME1 may be disposed in each subpixel SPXn and each of the second electrode RME2 and the third RME3 may be disposed over neighboring subpixel SPXn in the first direction DR1. The second electrode RME2 may include a first extended portion RM_S11, and a first-first branch portion RM_E11 and a first-second branch portion RM_E12 that branch out in two directions from the first extended portion RM_S11. The first-first branch portion RM_E11 branching out from the first extended portion RM_S11 may be adjacent to and faces the first electrode RME1 and the first-second branch portion RM_E12 may be disposed in another subpixel SPXn that is spaced apart in the first direction DR1. The first-first branch portion RM_E11 and the first-second branch portion RM_E12 of the second electrode RME2 may branch out in the emission area EMA and may be merged back to the first extended portion RM_S11 in the subarea SA.

The third electrode RME3 may include a second extending portion RM_S21, and a second-first branch portion RM_E21 and a second-second branch portion RM_E22 that branch out in two directions from the second extended portion RM_S21. The second-first branch portion RM_E21 branching out from the second extended portion RM_E21 may be disposed in another subpixel SPXn spaced apart in the first direction DR1 and the second-second branch portion RM_E22 may be adjacent to and faces the first electrode RME1. The second-first branch portion RM_E21 and the second-second branch portion RM_E22 of the third electrode RME3 may branch out in the emission area EMA and may be merged back to the second extended portion RM_S21 in the subarea SA.

In the emission area EMA of the first subpixel SPX1, the first electrode RME1, the first-first branch portion RM_E11 of the second electrode RME2, and the second-second branch portion RM_E22 of the third electrode RME3 may be disposed. For convenience of description, the second electrode RME2 and the third electrode RME3 will be separately named and described, but substantially, the second electrode RME2 and the third electrode RME3 are one electrode. For example, from the viewpoint of another sub-pixel SPXn spaced apart in the first direction DR1, the third electrode RME3 may be a second electrode RME2.

The first electrode RME1, the second electrode RME2, and the third electrode RME3 may be electrically connected to the third conductive layer respectively through a first via hole CTD1, a second via hole CTD2, and a third via hole CTS each of which overlap the bank layer BNL. The first electrode RME1 may be in contact with the first conductive pattern CDP1 and the first voltage line VL1 through the first via hole CTD1 and the second via hole CTD2 that pass through the via layer VIA and protective layer PV under the first electrode RME1. The first via hole CTD1 may electrically connect the first electrode RME1 to the first conductive pattern CDP1, so that the first supply voltage of the first transistor T1 may be applied to the first electrode RME1 through the first conductive pattern CDP1. The second via hole CTD2 may electrically connect the first electrode RME1 to the first voltage line VL1, so that a signal for aligning the light-emitting elements ED may be applied to the first electrode RME1 through the first voltage line VL1. As will be described below, the first electrode RME1 may be separated from the separation portion ROP after the light-emitting elements ED are aligned, so that the first electrode RME1 may be applied a signal from the first transistor T1 through the first vial hole CTD1 without receiving a signal from the first voltage line VL1.

The second electrode RME2 and the third electrode RME3 may be in contact with the second voltage line VL2 through the third via hole CTS that passes through the via layer VIA and a passivation layer PVX under the second electrode RME2 and the third electrode RME3. The first electrode RME1 may be electrically connected to the first transistor T1 through the first conductive pattern CDP1 and be applied the first supply voltage, and the second electrode RME2 and the third electrode RME3 may be electrically connected to the second voltage line VL2 and be applied the second supply voltage.

The first electrodes RME disposed in neighboring subpixels SPXn in the second direction DR2 or in a direction opposite to the second direction DR2 may be spaced apart from each other in the separation portion ROP of the subarea SA. The first electrode RME1 may be formed by forming a single electrode line extended in the second direction DR2 and then separating the single electrode line into multiple electrode lines during a subsequent process after the light-emitting elements ED are disposed. The electrode line may be used to generate an electric field in the subpixel SPXn to align the light-emitting elements ED during the process of manufacturing the display device 10.

After aligning the light-emitting elements ED, the electrode lines may be separated in the separation portion ROP so that the electrodes RME spaced apart from each other in the second direction DR2 may be formed. The process of separating the electrode lines may be performed after the process of forming a second insulating layer PAS2, and the second insulating layer PAS2 may not be disposed in the separation portion ROP. The second insulating layer PAS2 may be utilized as a mask pattern during the process of separating the electrode lines.

The electrodes RME may be electrically connected to the light-emitting element ED. Each electrode RME may be electrically connected to the light-emitting element ED through the connection electrode CNE (CEN1, CNE2, and CNE3) which will be described below, and may transmit a signal applied from a lower conductive layer to the light-emitting element ED.

Each of the electrodes RME may include a conductive material having high reflectivity. For example, the electrodes RME may include a metal such as silver (Ag), copper (Cu) and aluminum (Al) as the high reflective material, and may be an alloy including aluminum (Al), nickel (Ni), lanthanum (La), etc. The electrodes RME may reflect light that is emitted from the light-emitting elements ED and travels toward the side surfaces of the bank patterns BP1 and BP2 toward the upper side of each of the sub-pixels SPXn However, the disclosure is not limited thereto, and each of the electrodes may include a transparent conductive material. For example, each electrode RME may include a material, such as TO, IZO, ITZO, and the like. In some embodiments, each electrode RME may have a structure in which one or more layers including a transparent conductive material and a metal with high reflectivity are stacked each other or may include a single layer containing both a transparent conductive material and a metal with high reflectivity. For example, each electrode RME may have a stacked structure of ITO/Ag/ITO, ITO/Ag/IZO, or ITO/Ag/ITZO/IZO.

A first insulating layer PAS1 may be disposed on the via layer VIA, the bank patterns BP1 and BP2, and the electrodes RME. The first insulating layer PAS1 may cover the electrodes RME and the bank patterns BP1 and BP2. The first insulating layer PAS1 may not be disposed in the separation portion ROP where the neighboring electrodes RME in the second direction DR2 are spaced apart from each other in the subarea SA. The first insulating layer PAS1 may protect the electrodes RME and also insulate the electrodes RME from each other. Further, the first insulating layer PAS1 may prevent or reduce damage to the light-emitting element ED provided on the first insulating layer PAS1 from direct contact with other members. In an embodiment, the first insulating layer PAS1 may be stepped, such that a portion of an upper surface of the first insulating layer PAS1 is recessed between the electrodes RME that are spaced apart from each other in the first direction DR1. The light-emitting elements ED may be disposed on the stepped upper surface of the first insulating layer PAS1 and a space may be formed between the light-emitting elements ED and the first insulating layer PAS1. The second insulating layer PAS2, which will be described below, may fill the space.

The first insulating layer PAS1 may include multiple contact portions CT1 and CT2 which partially expose upper surfaces of the electrodes RME. The contact portions CT1 and CT2 may penetrate the first insulating layer PAS1, and the first connection electrode CNE1 and the second connection electrode CNE2 to be described below may be in contact with the electrodes RME exposed through the contact portions CT1 and CT2.

The bank layer BNL may be disposed on the first insulating layer PAS1. The bank layer BNL may include portions extending in the first direction DR1 and the second direction DR2 to form a lattice pattern in a plan view. The bank layer BNL may be disposed along the boundaries of neighboring subpixels SPXn to define each subpixel SPXn. The bank layer BNL may surround the emission area EMA and the subarea SA. The areas defined and opened by the bank layer BNL may be the emission area EMA and the subarea SA.

The bank layer BNL may have a predetermined (or selectable) height. In some embodiments, a height of an upper surface of the bank layer BNL may be higher than that of each of the bank patterns BP1 and BP2, and the thickness of the bank layer BNL may be equal to or greater than that of the bank patterns BP1 and BP2 in a cross-sectional view. However, the disclosure is not limited thereto, and the height of the upper surface of the bank layer BNL may be equal to or smaller than that of the bank patterns BP1 and BP2, and the thickness of the bank layer BNL may be smaller than that of the bank patterns BP1 and BP2. The bank layer BNL may prevent the ink from overflowing to adjacent subpixels SPXn during the inkjet printing process of manufacturing the display device 10. The bank layer BNL may prevent the ink in which different light-emitting elements ED are dispersed for each of the different subpixels SPXn from being mixed. The bank layer BNL may include, but is not limited to, polyimide (PI), like the bank patterns BP1 and BP2.

The light-emitting elements ED may be disposed on the first insulating layer PAS1. The light-emitting element ED may include multiple layers arranged horizontally on an upper surface of the substrate SUB. The direction in which the light-emitting element ED of the display device 10 extends may be parallel to the substrate SUB, and the semiconductor layers included in the light-emitting element ED may be sequentially arranged along a direction parallel to the upper surface of the substrate SUB. However, the disclosure is not limited thereto. In some embodiments, in case that the light-emitting element ED has a different structure, the layers may be arranged perpendicular to the substrate SUB.

The light-emitting elements ED may be disposed between the bank patterns BP1 and BP2, or on different electrodes RME, respectively. Some light-emitting elements ED may be disposed between the first bank pattern BP1 and the second bank pattern BP2, and some other light-emitting elements ED may be disposed between another first bank pattern BP1 and another second bank pattern BP2. According to an embodiment, the light-emitting elements ED may include a first light-emitting element ED1 disposed between the first bank pattern BP1 and the second bank pattern BP2 that are located on the right side in the emission area EMA, and a second light-emitting element disposed between the first bank pattern BP1 and the second bank pattern BP2 that are located on the left side in the emission area EMA. The first light-emitting element ED1 may be disposed on the first electrode RME1 and the third electrode RME3, and the second light-emitting element ED2 may be disposed on the first electrode RME1 and the second electrode RME2. The first light-emitting element ED1 may be disposed adjacent to the right side of the emission area EMA of the corresponding subpixel SPXn, and the second light-emitting element ED2 may be disposed adjacent to the left side of the emission area EMA of the corresponding subpixel SPXn. However, the light-emitting elements ED are not distinguished from one another according to the location where the light-emitting element ED is disposed, and may be distinguished from one another according to a connection relationship with the connection electrode CNE, which will be described below. Each of the light-emitting elements ED may have different connection electrodes CNE in contact with both ends thereof according to the arrangement structure of the connection electrodes CNE, and may be distinguished as different light-emitting elements ED depending on the type of the connection electrodes CNE in contact with the light-emitting element ED.

The light-emitting elements ED may be in contact with and electrically connected to the connection electrodes CNE1, CNE2, and CNE3. A portion of the semiconductor layer may be exposed from an extended end of each of the light-emitting element ED, so that the exposed semiconductor layer may be in contact with the connection electrodes CNE. A first end of the first light-emitting element ED1 may be in contact with the first connection electrode CNE1 and a second end of the first light-emitting element ED1 may be in contact with a portion (a third-first extended portion CN_E1) of the third connection electrode CNE3. A first end of the second light-emitting element ED2 may be in contact with the second connection electrode CNE2 and a second end of the second light-emitting element ED2 may be in contact with the other portion (a third-second extended portion CN_E2) of the third connection electrode CNE3. Each of the light-emitting elements ED may be electrically connected to the electrode RME and the conductive layers below the via layer VIA through the connection electrodes CNE, and may emit light of a specific wavelength band in response to an electrical signal applied thereto.

The second insulating layer PAS2 may be disposed on the light-emitting elements ED and the first insulating layer PAS1. The second insulating layer PAS2 may include a pattern portion extending in the second direction DR2 between the bank patterns BP1 and BP2 and may be disposed on the light-emitting elements ED. The pattern portion may be disposed to partially surround the outer surface of the light-emitting element ED and may not cover both sides or both ends of the light-emitting element ED. The pattern portion may form a linear or island-shaped pattern in each subpixel SPXn in a plan view. The pattern portion of the second insulating layer PAS2 may protect the light-emitting elements ED, and also fix the light-emitting elements ED in the process of manufacturing the display device 10.

The second insulating layer PAS2 may be disposed to fill the space between the light-emitting elements ED and the first insulating layer PAS1 thereunder. For example, the second insulating layer PAS2 may be formed to entirely cover the light-emitting elements ED and then may be patterned to expose both ends of the light-emitting elements ED, and a portion of the second insulating layer PAS2 may fill the space between the light-emitting elements ED and the first insulating layer PAS1.

A portion of the second insulating layer PAS2 may be disposed above the bank layer BNL and in the subareas SA. The second insulating layer PAS2 may include contact portions CT1 and CT2 disposed in the subarea SA. The second insulating layer PAS2 may include a first contact portion CT1 disposed to overlap the first electrode RME1 and a second contact portion CT2 disposed to overlap the second electrode RME2. The contact portions CT1 and CT2 may also penetrate the second insulating layer PAS2 in addition to the first insulating layer PAS1. The first contact portion CT1 and the second contact portion CT2 may expose a portion of the upper surface of the first electrode RME1 or the second RME2.

The connection electrodes CNE1, CNE2, and CNE3 may include the first connection electrode CNE1 and the second connection electrode CNE2 that are first type connection electrodes, and the third connection electrode CNE3 that is a second type connection electrode.

The first connection electrode CNE1 may have a shape extending in the second direction DR2 and may be disposed on the first electrode RME1. The portion of the first connection electrode CNE1 disposed on the second bank pattern BP2 may overlap the first electrode RME1 and may extend therefrom in the second direction DR2 to extend over the bank layer BNL to the subarea SA located above the emission area EMA in a plan view. The first connection electrode CNE1 may be electrically connected to at least one of the first electrode RME1 and the first conductive pattern CDP1 through the first contact portion CT1 in the subarea SA.

The second connection electrode CNE2 may have a shape extending in the second direction DR2 and may be disposed on the second electrode RME2. The portion of the second connection electrode CNE2 disposed on the first bank pattern BP1 may overlap the second electrode RME2 and may extend therefrom in the second direction DR2 to extend over the bank layer BNL to the subarea SA located above the emission area EMA in a plan view. The second connection electrode CNE2 may be in contact with the second voltage line VL2 through the second contact portion CT2 in the subarea SA.

The first connection electrode CNE1 may be disposed adjacent to the second connection electrode CNE2 with the third connection electrode CNE3 interposed therebetween. The first connection electrode CNE1 and the second connection electrode CNE2 may be disposed in parallel with each other, and may extend over the emission area EMA and the subarea SA.

The third connection electrode CNE3 may be disposed to overlap the first electrode RME1 and the third electrode RME3. Specifically, the third connection electrode CNE3 may include third extended portions CN_E1 and CN_E2 extended in the second direction DR2 and a first connection portion CN_B1 that connects the third extended portions CN_E1 and CN_E2. The third extended portions may include a third-first extended portion CN_E1 and a third-second extended portion CN_2. The third-first extended portion CN_E1 may be disposed on the third electrode RME3 in the emission area EMA and the third-second extended portion CN_E2 may be disposed on the first electrode RME1 in the emission area EMA. The first connection portion CN_B1 may extend in the first direction DR1 on the bank layer BNL disposed on a lower portion of the emission area EMA and electrically connect the third-first extended portion CN_E1 and the third-second extended portion CN_E2. The third connection electrode CNE3 may be disposed on the emission area EMA and the bank layer BNL and may not be connected to the third electrode RME3. The third connection electrode CNE3 may be in a floating state in which the third connection electrode CNE3 is not connected to other lines or electrodes. The third connection electrode CNE3 may transmit a signal applied through the light-emitting elements ED. The first light-emitting element ED1 and the second light-emitting element ED2 may be electrically connected in series to each other only through the third connection electrode CNE3.

The third insulating layer PAS3 may be disposed on the third connection electrode CNE3, the first insulating layer PAS1, and the second insulating layer PAS2. The third insulating layer PAS3 may be disposed to cover the third connection electrode CNE3 to insulate the third connection electrode CNE3 from the first connection electrode CNE1 and the second connection electrode CNE2. The first connection electrode CNE1 and the second connection electrode CNE2 may be disposed on the third insulating layer PAS3.

Although not illustrated, an additional insulating layer may be further disposed on the third insulating layer PAS3, the first connection electrode CNE1, and the second connection electrode CNE2. The additional insulating layer may function to protect the members disposed on the substrate SUB from the external environment. The first insulating layer PAS1, the second insulating layer PAS2, and the third insulating layer PAS3 described above may include an inorganic insulating material or an organic insulating material.

The bank layer BNL may include a bank extension portion BNE partially extended to the subarea SA.

Referring to FIGS. 6 to 8, the first via hole CTD1 through which the first electrode RME1 contacts the first conductive pattern CDP1 may partially overlap the bank layer BNL in a plan view, and at least a portion thereof may extend to the subarea SA. In the cross-sectional structure of the first via hole CTD1, the protective layer PV and the via layer VIA may be disposed on the first conductive pattern CDP1, and the first via hole CTD1 penetrating the protective layer PV and the via layer VIA and exposing a portion of the upper surface of the first conductive pattern CDP1 may be disposed. The first electrode RME1 may be disposed on the via layer VIA and may be in direct contact with the upper surface of the first conductive pattern CDP1 through the first via hole CTD1. The first insulating layer PAS1 may be entirely disposed on the first electrode RME1, and the bank layer BNL may be disposed on the first insulating layer PAS1.

The bank layer BNL may fill a portion of the first via hole CTD1 and may be disposed on the first insulating layer PAS1. In case that the bank layer BNL is not disposed in the first via hole CTD1, a significant step difference may occur due to the thickness of the via layer VIA. As shown in FIG. 4, the first connection electrode CNE1 and the second connection electrode CNE2 that are adjacent to each other in the first direction DR1 may be fabricated by being patterned using the same process, in which photoresist in the patterning process may remain due to the significant step difference of the first via hole CTD1. As a result, an electrode material may remain in the first via hole CTD1, which may cause a short-circuit where the first connection electrode CNE1 and the second connection electrode CNE2 are electrically connected to each other.

In the current embodiment, the bank extension portion BNE may be formed by extending the bank layer BNL from an area between the first connection electrode CNE1 and the second connection electrode CNE2 to a portion of the first via hole CTD1. The bank extension portion BNE may be disposed between the first connection electrode CNE1 and the second connection electrode CNE2 and may extend in a direction in parallel with the first connection electrode CNE1 or the second connection electrode CNE2 in a plan view, for example, in the second direction DR2. The bank extension portion BNE may be a protruding area of the bank layer BNL which protrudes and extends towards the subarea SA. The bank extension portion BNE may protrude and extend from the bank layer BNL, which extends in the first direction DR1, in the second direction DR2. The bank extension portion BNE may cover and overlap at least a portion of the first via hole CTD1 disposed in the subarea SA and may be disposed to overlap the first electrode RME1. The bank extension portion BNE may completely overlap the first electrode RME1 in a plan view, and may not protrude outward from the first electrode RME1. For example, one side surface of the bank extension portion BNE may be spaced and disposed inwardly from one side surface of the adjacent first electrode RME1.

As shown in FIGS. 6 and 7, the first via hole CTD1 may overlap the first electrode RME1 and the first connection electrode CNE1, and the first via hole CTD1 may entirely overlap the first electrode RME1. The bank extension portion BNE extended to the subarea SA may cover the first via hole CTD1 between the first connection electrode CNE1 and the second connection electrode CNE2, so that the step difference of the first via hole CTD1 corresponding to the area between the first connection electrode CNE1 and the second connection electrode CNE2 may be reduced. Accordingly, the short-circuit defect between the first connection electrode CNE1 and the second connection electrode CNE2 which may occur due to the step difference of the first via hole CTD1 may be prevented.

In an embodiment, the bank extension portion BNE may not cover the entire first via hole CTD1, and may cover a portion that corresponds to the area between the first connection electrode CNE1 and the second connection electrode CNE2. For example, a portion of the first via hole CTD1 may overlap the bank extended portion BNE, and a remaining portion of the first via hole CTD1 may not overlap the bank extension portion BNE.

Referring back to FIG. 4, the first via hole CTD1 and the second via hole CTD2 may be disposed to be adjacent to each other. In case that the bank extension portion BNE overlaps the entire first via hole CTD1, reflow or overflow of a bank material may occur in the process of forming the bank extension portion BNE so that a bank may be formed in the second via hole CTD2. As a result, a contact defect between the first connection electrode CNE1 and the first electrode RME1 may occur in the second via hole CTD2. In one embodiment, the bank extension portion BNE may not overlap a portion of the first via hole CTD1, for example, a portion of the first via hole CTD1 overlapping the first connection electrode CNE1, so that the contact defect between the first connection electrode CNE1 and the first electrode RME1 in the second via hole CTD2 may be prevented.

Figure 9:
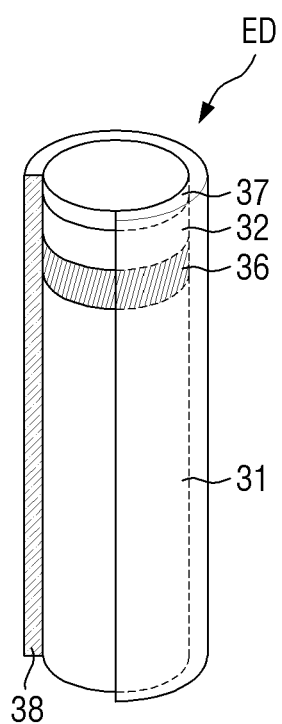
FIG. 9 is a perspective view of a light-emitting element according to an embodiment of the disclosure.

FIG. 9 is a perspective view of a light-emitting element according to an embodiment of the disclosure.

The light-emitting element ED may be a light emitting diode (LED). Specifically, the light-emitting element ED may be an inorganic LED having a size of micrometers or nanometers and made of an inorganic material. When an electric field is formed in a specific direction between two electrodes facing each other, the light-emitting element ED may be aligned between the two electrodes in which polarity is formed.

The light-emitting element ED according to an embodiment may have a shape extending in one direction. The light-emitting element ED may be in a shape of a cylinder, a rod, a wire, a tube, or the like. However, the shape of the light-emitting element ED is not limited thereto, and the light-emitting element ED may have a polygonal prism shape, such as a regular cube, a rectangular parallelepiped, and a hexagonal prism, or may have various other suitable shapes, such as a shape extending in one direction and having a partially inclined outer surface.

The light-emitting element ED may include a semiconductor layer doped with any conductivity type (e.g., p-type or n-type) impurities. The semiconductor layer may emit light in a specific wavelength range by receiving an electrical signal applied from an external power source. The light-emitting element ED may include a first semiconductor layer 31, a second semiconductor layer 32, an emissive layer 36, an electrode layer 37, and an insulating layer 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the material of the first semiconductor layer 31 may be any one or more of n-type doped AlGaInN, GaN, AlGaN, InGaN, AlN, and InN. An n-type dopant doped to the first semiconductor layer 31 may be Si, Ge, Sn, Se, or the like.

The second semiconductor layer 32 is disposed on the first semiconductor layer 31 with the emissive layer 36 interposed between them. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the material of the second semiconductor layer 32 may be any one or more of p-type doped AlGaInN, GaN, AlGaN, InGaN, AlN, and InN. A p-type dopant doped to the second semiconductor layer 32 may be Mg, Zn, Ca, Ba, or the like.

Although it is illustrated in the drawing that each of the first semiconductor layer 31 and the second semiconductor layer 32 are one layer, the disclosure is not limited thereto. Depending on the material of the emissive layer 36, the first semiconductor layer 31 and the second semiconductor layer 32 may include multiple layers (e.g., may further include other layers), such as a cladding layer or a tensile strain barrier reducing (TSBR) layer.

The emissive layer 36 may be disposed between the first semiconductor layer 31 and the second semiconductor layer 32. The emissive layer 36 may include a material having a single or multiple quantum well structure. In case that the emissive layer 36 includes a material having a multiple quantum well structure, the emissive layer 36 may have a structure in which multiple quantum layers and well layers are alternately stacked each other. The emissive layer 36 may emit light by coupling of electron-hole pairs according to an electrical signal applied through the first semiconductor layer 31 and the second semiconductor layer 32. The emissive layer 36 may include a material, such as AlGaN or AlGaInN. Particularly, in case that the emissive layer 36 has a structure in which quantum layers and well layers are alternately stacked each other in a multiple quantum well structure, the quantum layer may include a material, such as AlGaN or AlGaInN, and the well layer may include a material, such as GaN or AlInN.

The emissive layer 36 may have a structure in which semiconductor materials having large band gap energy and semiconductor materials having small band gap energy are alternately stacked each other, and the emissive layer 36 may include Group III to V semiconductor materials according to the wavelength band of the emitted light. The emissive layer 36 is not limited to emitting light of a blue wavelength band, and it may emit light of a red or green wavelength band in some embodiments.

The electrode layer 37 may be an ohmic connection electrode. However, the disclosure is not limited thereto, and the electrode layer 37 may be a Schottky connection electrode. The light-emitting element ED may include at least one electrode layer 37. The light-emitting element ED may include one or more electrode layers 37. However, the disclosure is not limited thereto, and the electrode layer 37 may be omitted.

In the display device 10, in case that the light-emitting element ED is electrically connected to an electrode or a connection electrode, the electrode layer 37 may reduce the resistance between the light-emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO.

The insulating layer 38 may be disposed to surround the outer surfaces of the semiconductor layers and electrode layers of the light-emitting element ED described above. For example, the insulating layer 38 may be formed to surround at least the outer surface of the emissive layer 36 while exposing both ends of the light-emitting element ED in the length direction. Further, in cross-sectional view, the insulating layer 38 may have an upper surface, which is rounded in a region adjacent to at least one end of the light-emitting element ED.

The insulating layer 38 may include materials having insulating properties. For example, the insulating layer 38 may include at least one of silicon oxide (SiO$_x$), silicon nitride (SiN$_x$), silicon oxynitride (SiO$_x$N$_y$), aluminum nitride (AlN$_x$), aluminum oxide (AlO$_x$), or the like. Although it is illustrated in the drawing that the insulating layer 38 is formed as a single layer, the disclosure is not limited thereto. In some embodiments, the insulating layer 38 may be formed in a multilayer structure in which multiple layers are stacked each other.

The insulating layer 38 may function to protect the members. The insulating layer 38 may prevent an electrical short circuit that may occur in case that the emissive layer 36 directly contacts the electrode through which the electrical signal is transmitted to the light-emitting element ED. The insulating layer 38 may prevent a reduction in luminous efficiency of the light-emitting element ED.

Also, the insulating layer 38 may have an outer surface subjected to surface treatment. The light-emitting element ED dispersed in ink may be sprayed onto electrodes and then aligned. Here, the surface of the insulating film 38 may be hydrophobic or hydrophilic-treated so that the light-emitting element ED is kept separate in the ink without being aggregated with other adjacent light-emitting elements ED.

Hereinafter, another embodiment of the display device 10 will be described with further reference to other drawings.

Figure 10:
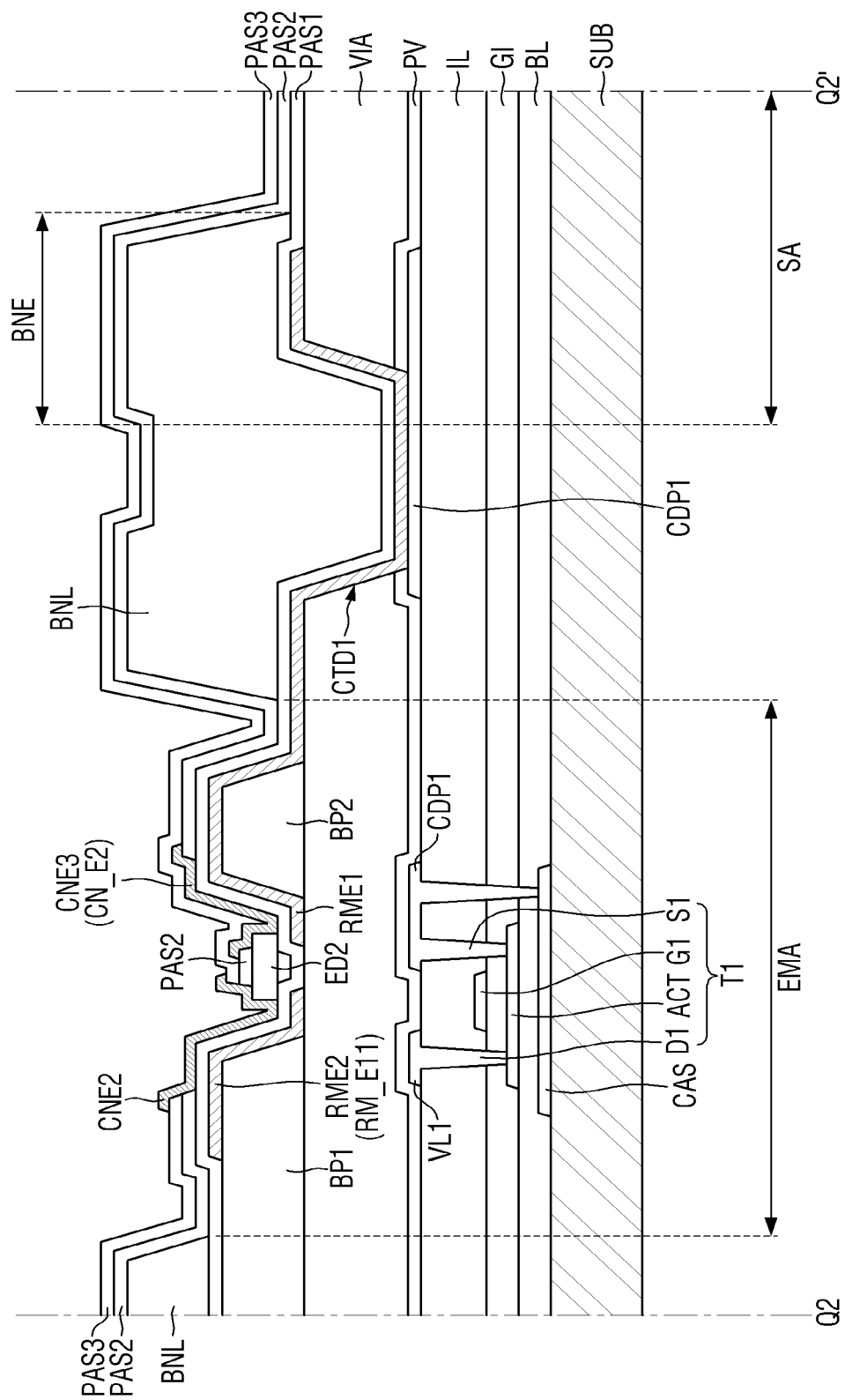
FIG. 10 is a schematic cross-sectional view of a display device according to another embodiment of the disclosure.
Figure 11:
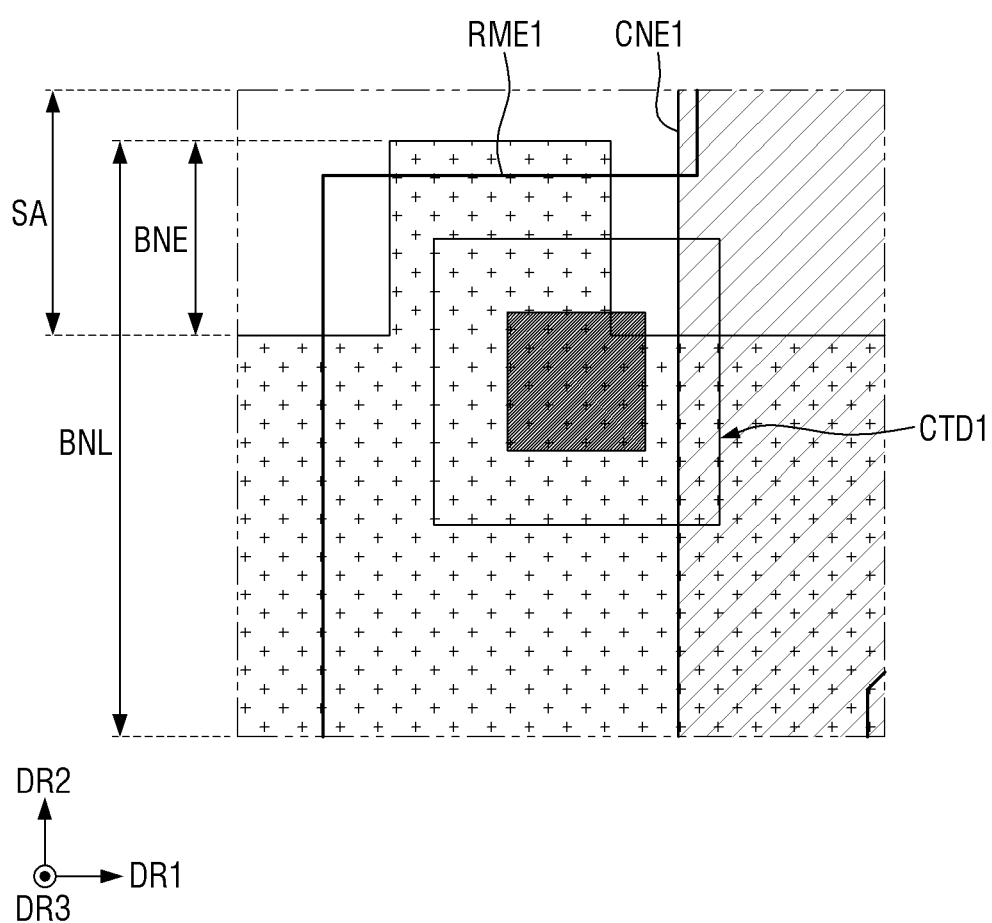
FIG. 11 is a plan view of a first via hole of a display device according to another embodiment of the disclosure.

FIG. 10 is a schematic cross-sectional view of a display device according to another embodiment of the disclosure. FIG. 11 is a plan view of a first via hole of a display device according to another embodiment of the disclosure.

Referring to FIGS. 10 and 11, the embodiment differs from the above-described embodiment in that a bank extension portion BNE extends further outward over the first electrode RME1 and the first conductive pattern CDP1. Hereinafter, descriptions redundant to the above-described embodiments will be omitted and the following description will focus on differences.

The bank extension portion BNE may be a protruding area of the bank layer BNL which protrudes and extends towards the subarea SA. The bank extension portion BNE may protrude and extend from the bank layer BNL, which extends in the first direction DR1, in the second direction DR2. The bank extension portion BNE may be disposed to overlap the first via hole CTD1 and the first electrode RME1. The bank extension portion BNE may be disposed to protrude outward from the first electrode RME1. For example, one side surface of the bank extension portion BNE may be spaced outwardly from one side surface of the first electrode RME 1. The bank extension portion BNE may be disposed to protrude outward from the first conductive pattern CDP1 in a plan view. For example, one side surface of the bank extension portion BNE may be spaced outwardly from one side surface of the first conductive pattern CDP1.

In the embodiment, the bank extension portion BNE may be disposed to protrude outward than one side surface of each of the first electrode RME1 and the first conductive pattern CDP1, so that a further increase of step difference of the bank extension portion BNE due to the thickness of the first electrode RME1 or the first conductive pattern CDP1 may be prevented.

As described above, the display device 10 according to embodiments may have the bank extension portion BNE formed to cover a portion of the first via hole CTD1 disposed between the first connection electrode CNE1 and the second connection electrode CNE2, so that a short-circuit defect between the first connection electrode CNE1 and the second connection electrode CNE2 caused by the step difference of the first via hole CTD1 may be prevented.

Hereinafter, a manufacturing process of the display device 10 according to an embodiment will be described with further reference to other drawings.

FIGS. 12 to 16 are schematic cross-sectional views illustrating the process of manufacturing a display device according to an embodiment of the disclosure. FIGS. 12 to 16 illustrate sequential schematic cross-sectional views illustrating the procedure of forming each layer in a subpixel SPXn of a display device 10, and each of FIGS. 12 to 16 corresponds to the schematic cross-sectional view of FIG. 6. The process of forming each layer may be performed using common patterning process and inkjet process. Hereinafter, description of each forming process will be described in brief, and the following description will focus on the procedure of formation.

Figure 12:
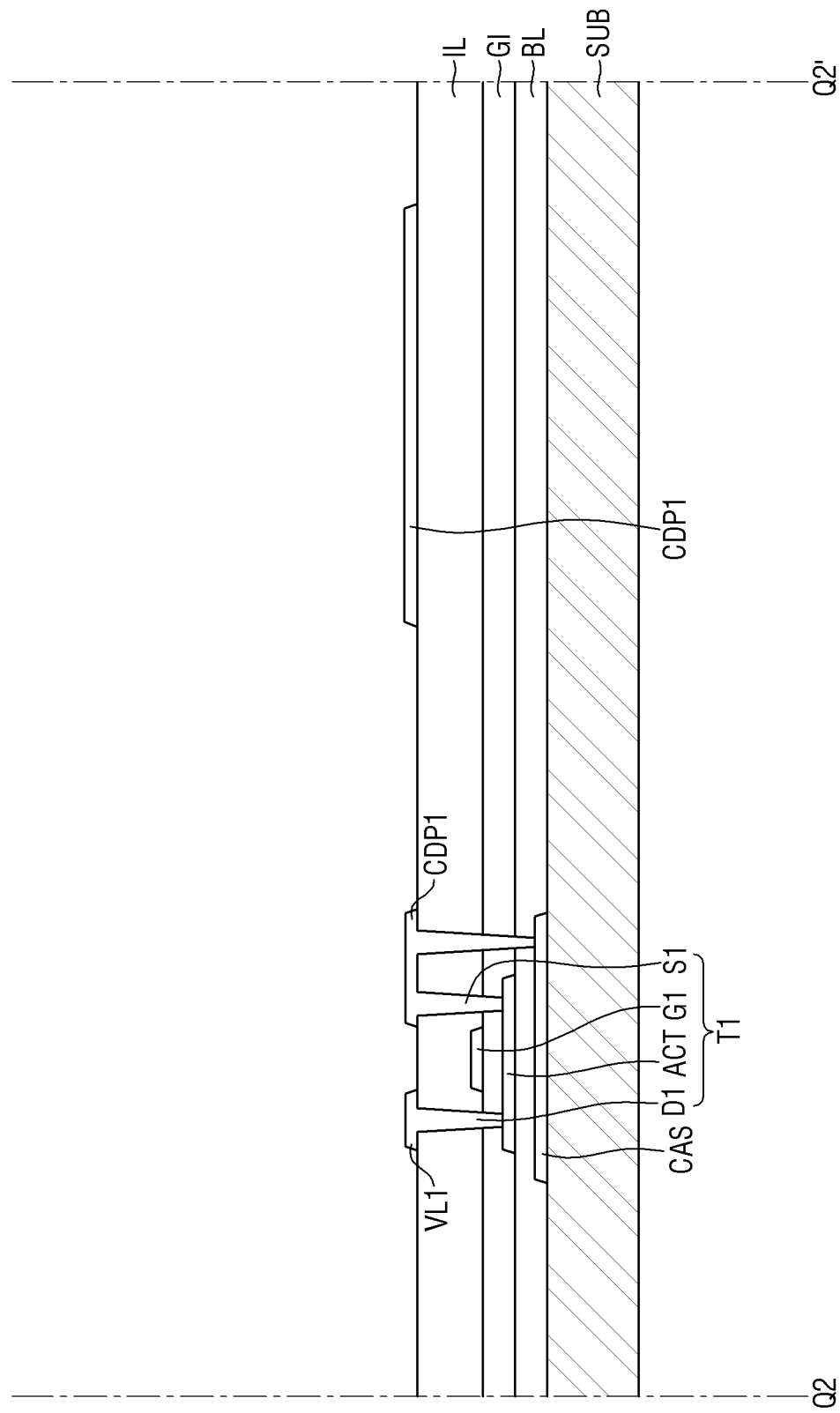
FIGS. 12 to 16 are schematic cross-sectional views illustrating the process of manufacturing a display device according to an embodiment of the disclosure.

Referring to FIG. 12, a first conductive layer material may be deposited on a substrate SUB and patterned to form a lower metal layer CAS. An inorganic insulating material may be deposited on the lower metal layer CAS to form a buffer layer BL, and a semiconductor material may be deposited on the buffer layer BL and patterned to form an active layer ACT. The active layer ACT may be formed to overlap the lower metal layer CAS. An inorganic insulating material may be deposited on the active layer ACT and the buffer layer BL to form a gate insulating layer GI. Thereafter, a second conductive layer material may be deposited on the gate insulating layer GI and patterned to form a gate electrode G1. The gate electrode G1 may be formed to overlap the active layer ACT.

An inorganic insulating material may be deposited on the gate electrode G1 to form an interlayer insulating layer IL. A third conductive layer material may be deposited on the interlayer insulating layer IL and patterned to form a source electrode S1, a drain electrode D1, and a first conductive pattern CDP1. Although not illustrated, a first voltage line VL1 (see FIG. 5) and a second voltage line VL2 (see FIG. 5) may also be formed. The source electrode S1 and the drain electrode D1 may be in contact with the active layer ACT through contact holes penetrating the gate insulating layer GI and the interlayer insulating layer IL. The first conductive pattern CDP1 may be in contact with the lower metal layer CAS through a contact hole penetrating the buffer layer BL, the gate insulating layer GI and the interlayer insulating layer IL.

Figure 13:
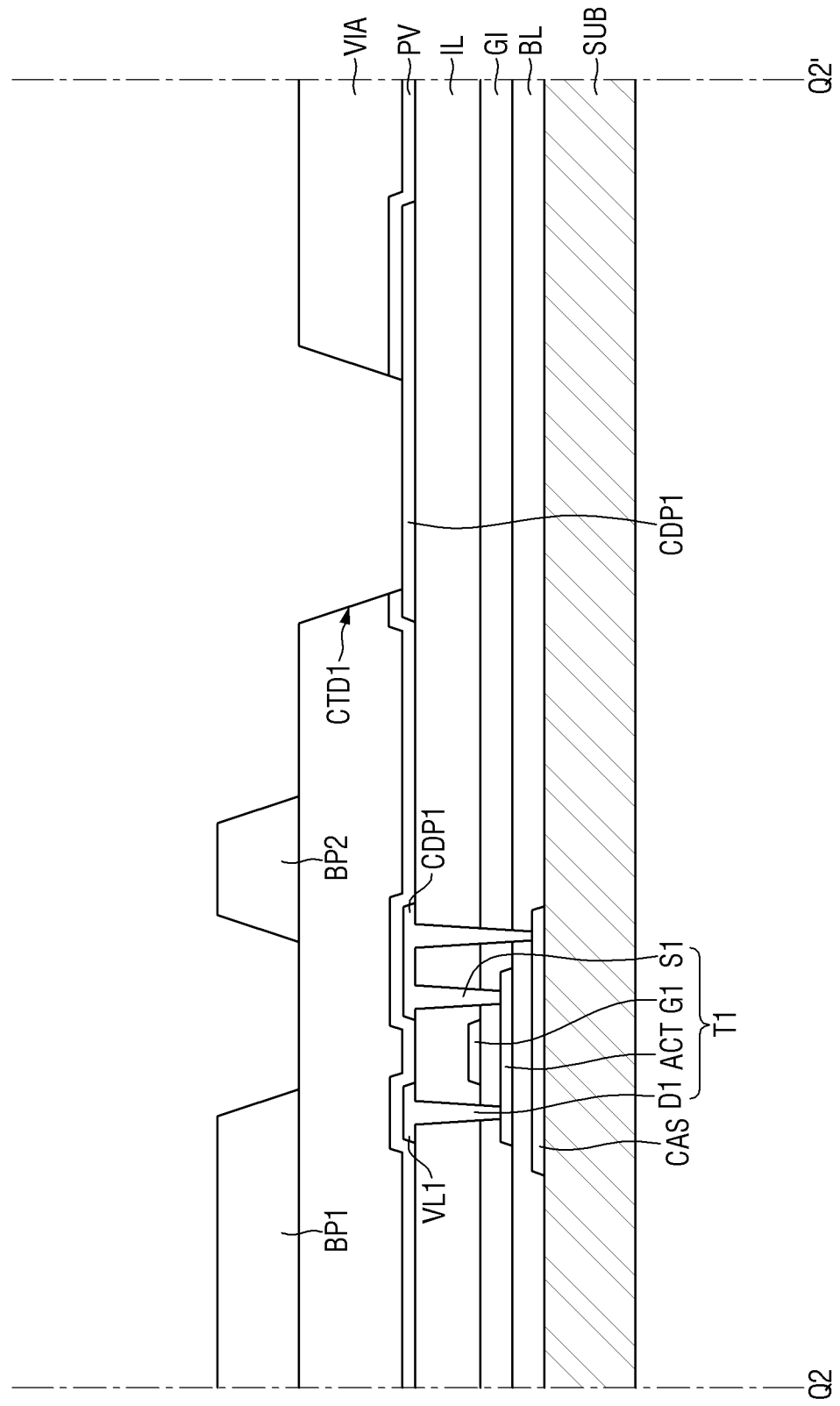

Referring to FIG. 13, an inorganic insulating material may be deposited on the source electrode S1, the drain electrode D1, and the first conductive pattern CDP1 to form a protective layer PV. A via layer VIA may be formed by applying an organic insulating material onto the protective layer PV. Thereafter, a first via hole CTD1 exposing a portion of an upper surface of the first conductive pattern CDP1 may be formed by etching the via layer VIA and the protective layer PV. Although not illustrated, a third via hole CTS (see FIG. 4) exposing a second voltage line may be formed. The etching process may be formed as, for example, a dry etching process or a wet etching process. The first via hole CTD1 may overlap a bank layer BNL, which will be described below, and may be at least partially formed in a subarea SA. A first bank pattern BP1 and a second bank pattern BP2 may be formed by applying an organic insulating material onto the via layer VIA and patterning the organic insulating material. Although not illustrated, the first bank pattern BP1 may be provided in plural.

Figure 14:
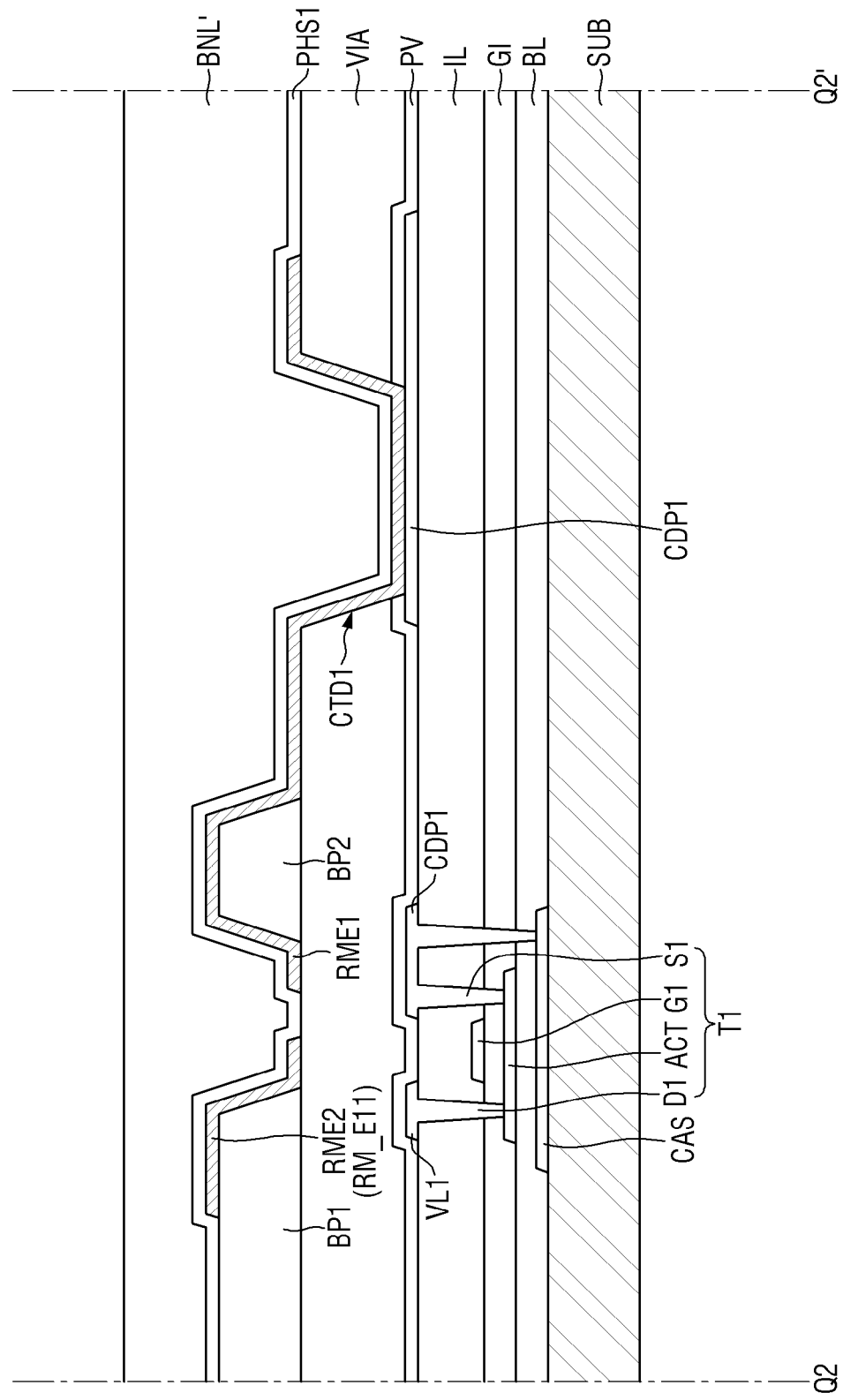

Referring to FIG. 14, a first electrode RME1 and a second electrode RME2 may be formed by depositing an electrode material onto the first bank pattern BP1, the second bank pattern BP2, and the via layer VIA and patterning the electrode material. Although not illustrated, a third electrode spaced apart from the first electrode RME1 and the second electrode RME2 may be formed. The first electrode RME1 may extend to the first via hole CTD1 and may be in direct contact with the first conductive pattern CDP1 through the first via hole CTD1. The second electrode RME2 may be in direct contact with the second voltage line through the third via hole. A first insulating layer PAS1 may be formed by depositing an inorganic insulating material on the first electrode RME1, the second electrode RME2, and the via layer VIA.

A bank material may be applied onto the first insulating layer PAS1 to form a bank material layer BNL'. The bank material layer BNL' may be formed using a solution process, such as inkjet printing, screen printing, spin coating, or the like.

Figure 15:
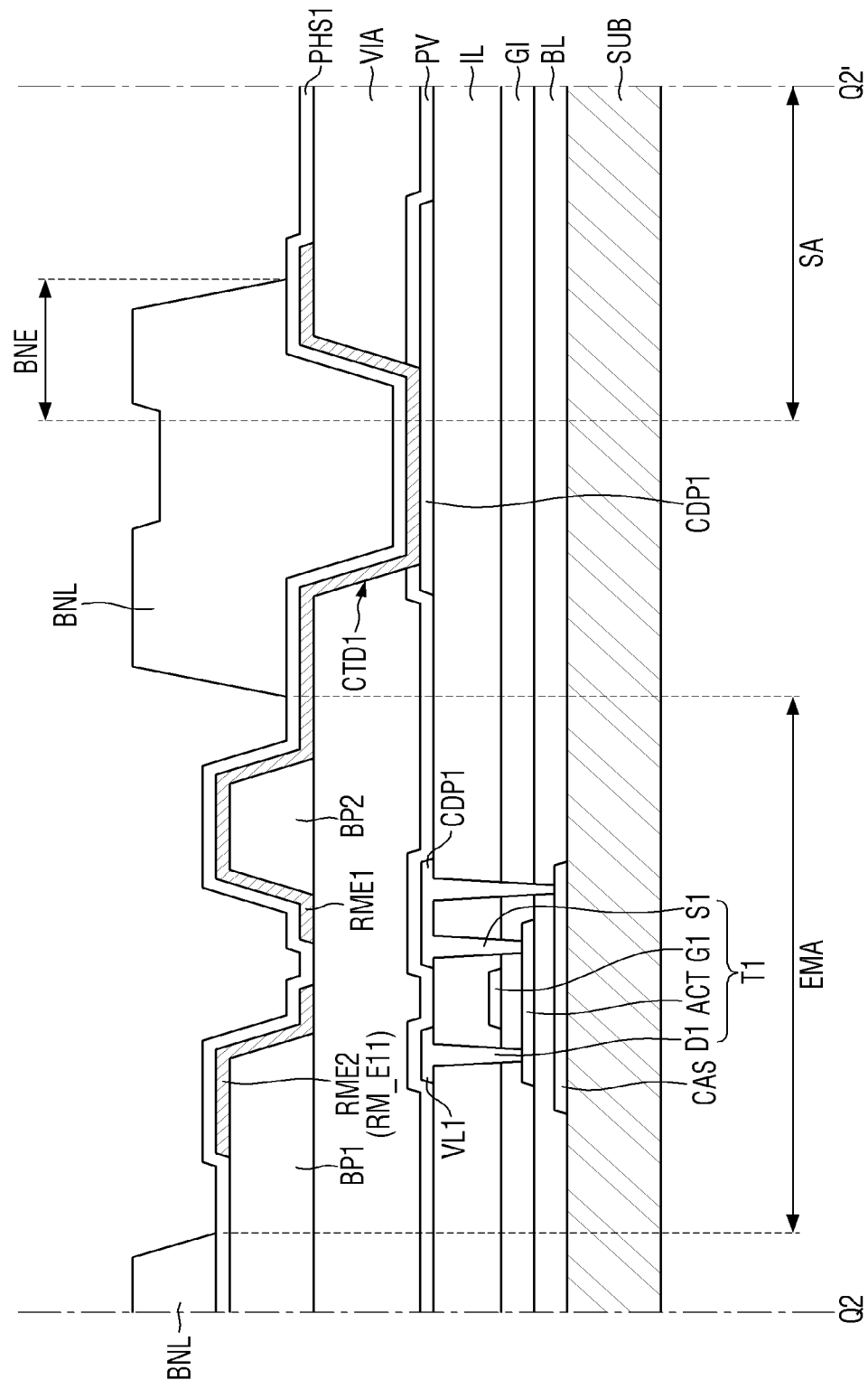

Referring to FIG. 15, the bank material layer BNL' may be patterned using a mask to form a bank layer BNL including a bank extension portion BNE. The bank layer BNL may be formed simultaneously with the bank extension portion BNE through, for example, an exposure process using a mask, a development process, a bake process, or an etching process. The bank layer BNL may define an emission area EMA and a subarea SA on the substrate SUB. For example, the first conductive pattern CDP1, the first electrode RME1, the second electrode RME2, the first bank pattern BP1, and the second bank pattern BP2 may be disposed in the emission area EMA defined by the bank layer BNL. The first electrode RME1, the second electrode RME2, and the first conductive pattern CDP1 that are extended from the emission area EMA may be disposed in the subarea SA defined by the bank layer BNL.

In an embodiment, the bank layer BNL may include the bank extension portion BNE extended to the subarea SA. The bank extension portion BNE may be formed to be extended to the subarea SA by adjusting the shape of a mask in the process of forming the bank material layer BNL'. The bank extension portion BNE may be disposed in the subarea SA to cover the first via hole CTD1 and may be disposed to overlap the first conductive pattern CDP1 and the first electrode RME1. The bank extension portion BNE may be formed by extending the bank layer BNL from an area between the first connection electrode CNE1 and the second connection electrode CNE2 (see FIG. 7) to a portion of the first via hole CTD1. The bank extension portion BNE may not protrude outward from the first electrode RME1. For example, one side surface of the bank extension portion BNE may be spaced inwardly from one side surface of the first electrode RME 1. However, the length of the bank extension portion BNE is not limited thereto.

The bank extension portion BNE may cover the first via hole CTD1 between the first connection electrode CNE1 and the second connection electrode CNE2, so that a step difference of the first via hole CTD1 corresponding to the area between the first connection electrode CNE1 and the second connection electrode CNE2 may be reduced. Accordingly, the short-circuit defect between the first connection electrode CNE1 and the second connection electrode CNE2 which may occur due to the step difference of the first via hole CTD1 may be prevented.

Figure 16:
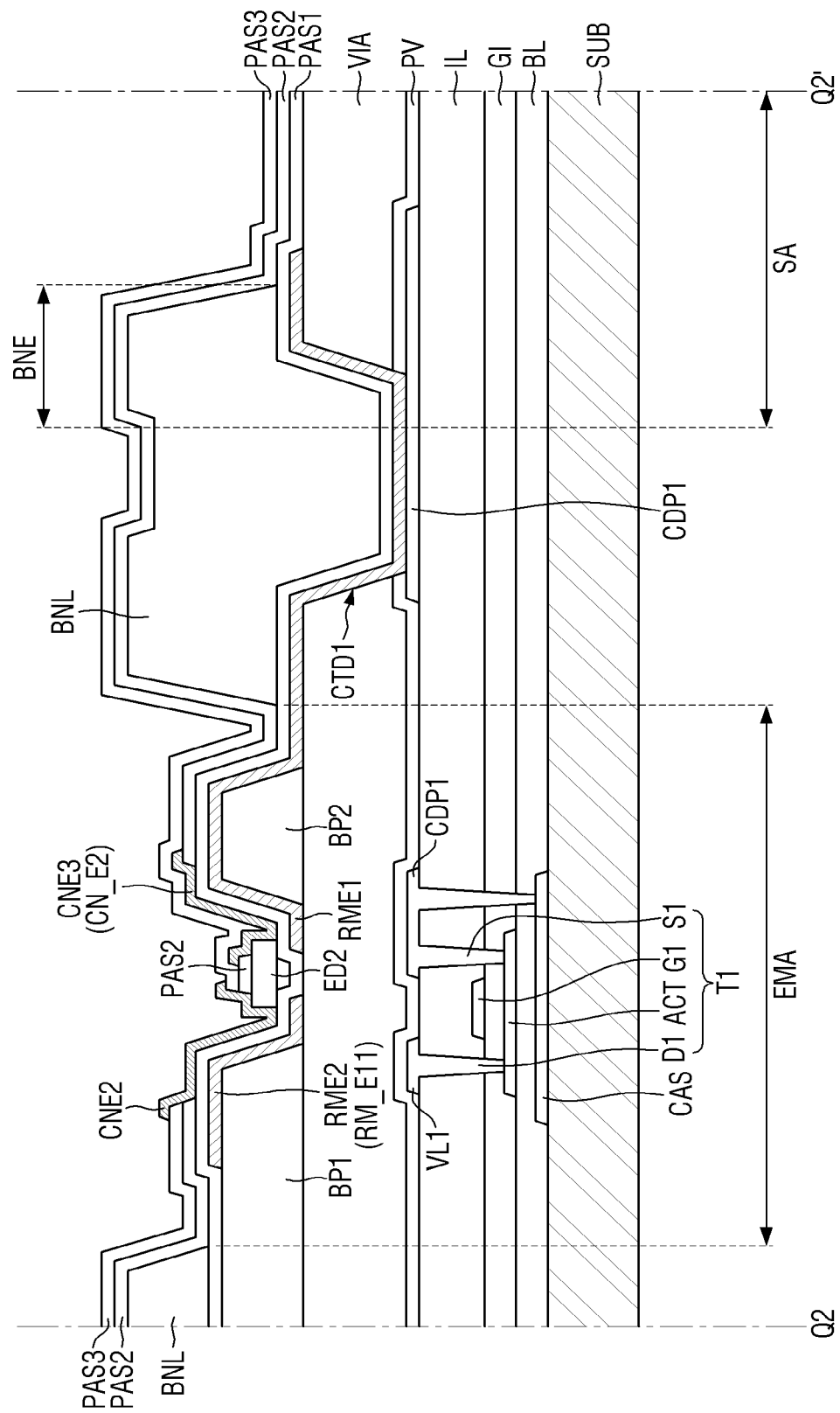

Referring to FIG. 16, light-emitting elements ED may be formed on the emission area EMA defined by the bank layer BNL. In an embodiment, the light-emitting elements ED may be disposed on the first electrode RME1 and the second electrode RME2 through an inkjet printing process. When ink in which the light-emitting elements ED are dispersed is sprayed in the emission area EMA surrounded by the bank layer BNL, an electrical signal may be applied to the first electrode RME 1 and the second electrode RME2, the position and orientation of the light-emitting elements ED may be changed, and the light-emitting elements ED may be placed on the first electrode RME1 and the second electrode RME2.

Thereafter, a second insulating layer PAS2 may be formed by depositing an inorganic insulating material on the light-emitting elements ED and the first insulating layer PAS1. The second insulating layer PAS2 may cover and fix the light-emitting elements ED. The second insulating layer PAS2 may be entirely applied onto the first insulating layer PAS1 in the emission area EMA and a patterning process in which both ends of the light-emitting elements ED are exposed may be performed.

A third connection electrode CNE3 may be formed by depositing a transparent electrode material on the light-emitting elements ED, the first insulating layer PAS2, and the second insulating layer PAS2 and patterning the transparent electrode material. The third connection electrode CNE3 may be in direct contact with first ends of the light-emitting elements ED and may be formed on the first insulating layer PAS1 and the second insulating layer PAS2. A third insulating layer PAS3 may be formed by depositing an inorganic insulating material on the third connection electrode CNE3 and the second insulating layer PAS2. The third insulating layer PAS3 may be disposed to cover the third connection electrode CNE3 and the second insulating layer PAS2. The second insulating layer PAS2 and the third insulating layer PAS3 described above may be formed to cover the bank layer BNL.

A second connection electrode CNE2 may be formed by depositing a transparent electrode material on the light-emitting elements ED, the first insulating layer PAS1, and the third insulating layer PAS3 and patterning the transparent electrode material. Although not illustrated, the first connection electrode CNE1 (see FIG. 5) and the second connection electrode CNE2 may be simultaneously formed. The second connection electrode CNE2 may be in direct contact with second ends of the light-emitting elements ED and may be formed on the first insulating layer PAS1 and the third insulating layer PAS3. In this manner, the display device 10 according to an embodiment may be manufactured.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed:

1. A display device comprising:
   a conductive pattern disposed on a substrate;
   a via layer disposed on the conductive pattern, comprising a via hole, and exposing the conductive pattern;
   a first electrode and a second electrode that are disposed on the via layer and spaced apart from each other;
   a first insulating layer disposed on the first electrode and the second electrode;
   a bank layer disposed on the first insulating layer and defining an emission area and a subarea;
   a light-emitting element disposed on the first insulating layer in the emission area; and
   a first connection electrode and a second connection electrode that are disposed on the first insulating layer and the light-emitting element, wherein the first connection electrode electrically contacts an end of the light-emitting element and the second connection electrode electrically contacts another end of the light-emitting element, the bank layer comprises a bank extension portion extended to the subarea, and the bank extension portion overlaps at least a portion of the via hole in a plan view.

2. The display device of claim 1, wherein the via hole overlaps the bank layer in a plan view, and at least a portion of the via hole is disposed in the subarea.

3. The display device of claim 2, wherein the bank extension portion overlaps at least a portion of the via hole disposed in the subarea in a plan view.

4. The display device of claim 1, further comprising:

a third connection electrode adjacent to the first connection electrode with the second connection electrode interposed therebetween, wherein the first connection electrode and the third connection electrode are disposed in parallel with each other in a plan view and extend over the emission area and the subarea.

5. The display device of claim 4, wherein the bank extension portion is disposed between the first connection electrode and the third connection electrode, and the bank extension portion protrudes and extends from the bank layer in a direction parallel to the first connection electrode or the third connection electrode in a plan view.

6. The display device of claim 4, wherein the via hole overlaps the first electrode and the first connection electrode, and the entire first via hole overlaps the first electrode, in a plan view.

7. The display device of claim 4, wherein the first connection electrode overlaps a portion of the via hole and does not overlap the bank extension portion in a plan view.

8. The display device of claim 1, wherein an entire area of the bank extension portion overlaps the first electrode in a plan view.

9. The display device of claim 1, wherein a side of the bank extension portion is disposed outside of a side of the adjacent first electrode in a plan view.

10. The display device of claim 1, wherein a side of the bank extension portion is disposed outside of a side of the adjacent conductive pattern in a plan view.

11. The display device of claim 1, further comprising:

a protective layer disposed between the conductive pattern and the via layer, wherein the via hole penetrates the via layer and the protective layer and exposes the conductive pattern.

12. The display device of claim 1, further comprising:

a second insulating layer disposed on the first insulating layer and the light-emitting element; and a third insulating layer disposed on the second insulating layer and overlapping the second connection electrode in a plan view, wherein the second insulating layer and the third insulating layer overlap the bank layer in a plan view.

13. A display device comprising:

a conductive pattern disposed on a substrate;

a via layer disposed on the conductive pattern, comprising a via hole, and exposing the conductive pattern;

a first electrode and a second electrode that are disposed on the via layer and spaced apart from each other; and a bank layer disposed on the via layer and defining an emission area and a subarea, wherein the bank layer comprises a bank extension portion extended to the subarea, the first electrode extends from the emission area to the subarea and is electrically connected to the conductive pattern through the via hole, at least a portion of the via hole is disposed in the subarea, and the bank extension portion overlaps the via hole and the first electrode in the subarea in a plan view.

14. The display device of claim 13, further comprising:

a first connection electrode disposed on the first electrode and a second connection electrode disposed on the second electrode, wherein the via hole and the bank extension portion are disposed between the first connection electrode and the second connection electrode.

15. The display device of claim 14, wherein at least a portion of the via hole overlaps the bank extension portion in a plan view, and another portion of the via hole does not overlap the bank extension portion in a plan view.

16. A method of manufacturing a display device, comprising:

forming a conductive pattern on a substrate;

forming, on the conductive pattern, a via layer comprising a via hole and exposing the conductive pattern;

forming a first electrode and a second electrode that are spaced apart from each other on the via layer;

forming, on the via layer, a bank layer defining an emission area and a subarea, the bank layer comprising a bank extension portion extending to the subarea;

forming a light-emitting element on the first electrode and the second electrode in the emission area; and forming a first connection electrode in electrical contact with an end of the light-emitting element and a second connection electrode in electrical contact with another end of the light-emitting element, wherein the bank extension portion overlaps at least a portion of the via hole in a plan view.

17. The method of claim 16, wherein the bank layer and the bank extension portion are simultaneously formed by forming a bank material layer on the via layer and patterning the bank material layer.

18. The method of claim 16, further comprising:

before the forming of the via layer, forming a protective layer disposed on the conductive pattern, wherein the via hole is formed by simultaneously etching both the protective layer and the via layer such that at least a portion of the via hole is disposed in the subarea.

19. The method of claim 16, wherein the bank extension portion is formed such that an entire area of the bank extension portion overlaps the first electrode in a plan view.

20. The method of claim 16, wherein the bank extension portion overlaps the first electrode and the conductive pattern in a plan view.

* * * * *